United States Patent
Okuda et al.

[11] Patent Number: 6,147,533
[45] Date of Patent: Nov. 14, 2000

[54] DATA COMMUNICATION RECEIVING ELEMENTS

[75] Inventors: Takanori Okuda, Kashiba; Naruichi Yokogawa, Kashihara; Takayuki Shimizu, Kitakatsuragi-gun; Fumitaka Nakamura, Yamatotakada, all of Japan

[73] Assignee: Sharp Kabushiki Kaisha, Osaka, Japan

[21] Appl. No.: 09/135,686

[22] Filed: Aug. 18, 1998

[30] Foreign Application Priority Data

Sep. 29, 1997 [JP] Japan .................................. 9-264618
Mar. 20, 1998 [JP] Japan ................................ 10-072871
Jun. 18, 1998 [JP] Japan ................................ 10-171482

[51] Int. Cl.[7] ...................................................... H03K 5/12
[52] U.S. Cl. .......................... 327/170; 327/134; 327/178
[58] Field of Search .................................... 327/100, 103, 327/130, 131, 134, 170, 178

[56] References Cited

U.S. PATENT DOCUMENTS

| | | | |
|---|---|---|---|
| 3,721,835 | 3/1973 | Hess | 327/323 |
| 4,137,468 | 1/1979 | Bosch | 327/180 |
| 4,613,973 | 9/1986 | Dahl | 375/37 |
| 4,636,744 | 1/1987 | King et al. | 330/295 |
| 4,638,255 | 1/1987 | Penney | 328/86 |
| 5,191,237 | 3/1993 | Tabeke | 257/419 |
| 5,200,716 | 4/1993 | Amano | 333/17.1 |
| 5,382,848 | 1/1995 | Burns et al. | 327/18 |
| 5,483,154 | 1/1996 | Chen | 324/76.66 |
| 5,587,679 | 12/1996 | Imamura | 327/170 |

FOREIGN PATENT DOCUMENTS

B2-2550680  8/1996  Japan .

*Primary Examiner*—Timothy P. Callahan
*Assistant Examiner*—An T. Luu

[57] ABSTRACT

A data communication receiving element includes a photo-receiving element for receiving an external light signal and for converting the light signal to a current signal. It further includes an amplifier circuit for amplifying the current signal after converting the current signal to a voltage signal. A waveform shaping circuit is included for shaping an output voltage waveform from the amplifier circuit to a substantially square pulse. Finally, an integrator is included for converting the substantially square pulse to a non-square pulse. This is achieved by extending a rising time necessary for shifting the substantially square pulse from a low potential level to a high potential level, and by extending a falling time necessary for shifting the substantially square pulse from the high potential level to the low potential level. As such, deterioration of an S/N ratio is suppressed.

16 Claims, 20 Drawing Sheets

DATA COMMUNICATION RECEIVING ELEMENTS

FIELD OF THE INVENTION

The present invention relates to a digital interface output circuit for a data communication receiver and to an arrangement of the same.

BACKGROUND OF THE INVENTION

Examples of today's infrared data communication. devices are remote controllers used in conjunction with most popular household electrical appliances personal computer peripheral equipment using the standard optical space communication elements IrDA1.0 and 1.1.

The remote controller has a transmission rate of about 1kbps and a one way communication path, but it is, characterized by its long transmission distance (over 10 m). On the other hand, a device using the optical space communication elements IrDA1.0 and 1.1 has a short transmission distance of about 1 m, but it is characterized by its transmission rate as great as 9.6 kbps–4 Mbps and its ability of sending a large volume of data bi-directionally.

There will be an increasing need to accelerate the operation speed to improve the transmission rate and upgrade the characteristics, such as sensitivity, to extend the transmission distance for the data communication receiving elements used in these data transmission devices. Further, it is inevitably necessary to lower a power source voltage for the data communication devices and downsize a product package. Thus, new techniques are required to solve the problems arising in accelerating the operation speed and upgrading the sensitivity of these data communication receiving elements.

FIG. 18 is a circuit diagram of a conventional data communication receiving element 101, which basically comprises a photo-receiving section 102 for receiving a light signal, an amplifier circuit 103 for amplifying a received signal, and a waveform shaping circuit 104 for shaping the waveform of the amplified signal.

The photo-receiving section 102 is composed of a photodiode PD101. The amplifier circuit 103 is composed of amplifiers AMP101 and AMP102 in two stages, and a capacitor C101 provided somewhere between the amplifiers AMP101 and AMP102. The amplifier AMP101 in the first stage includes a feedback resistor R101. The waveform shaping circuit 104 is composed of a peak hold circuit PH101, a voltage dividing circuit BC101, a comparator CMP101, and an output circuit OC101. Further, the voltage dividing circuit BC101 is composed of resistors R102 and R103, and the output circuit OC101 is composed of an output transistor Qo101 and a pull-up resistor R104.

The photodiode PD101 converts a received infrared light signal to an electrical signal (current), which is amplified by the amplifier circuit 103. Here, the amplifier AMP101 amplifies the electrical signal by converting an output current from the photodiode PD101 to a voltage. Also, only a signal component in an output voltage from the amplifier AMP101 is allowed to pass through the capacitor C101 and amplified by the amplifier AMP102 in the following stage.

An output voltage from the amplifier AMP102 is inputted to the peak hold circuit PH101 and the non-inverting input terminal of the comparator CMP101. An output voltage from the peak hold circuit PH101 is divided to a detection level in a predetermined ratio by the resistors R102 and R103 of the voltage dividing circuit BC101 first, and thence inputted to an inverting input terminal of the comparator CMP101.

The comparator CMP101 compares the output voltage from the amplifier AMP102 with the detection level, and outputs a voltage shaped into substantially a square pulse. The output transistor Qo101 of the output circuit OC101 switches ON/OFF in response to an output voltage from the comparator CMP101. When the output transistor Qo101 stays ON, it outputs a low-level output voltage Vo101 to an output terminal OUT101. On the other hand, when the output transistor Qo101 stays OFF, it outputs a, high-level output voltage Vo101 to the output terminal OUT101. At this point, the output voltage Vo101 is shaped into a substantially perfect square pulse.

FIGS. 19(a) through 19(c) show operation waveforms at each of the points L, M, N, 0 and P (output terminal OUT101) shown in FIG. 18. A waveform a of FIG. 19(a) represents a transmitted infrared signal (point L). In FIG. 19(b), a waveform b represents an output voltage (point M) from the amplifier circuit 103, a waveform c represents an output voltage (point N) from the peak hold circuit PH10, and a waveform d represents a detection level (point O) obtained by dividing the waveform c by means of the resistors R102 and R103 of the voltage dividing circuit BC101. A waveform e of FIG. 19(c) represents the output voltage Vo101 (point P) outputted to the output terminal OUT101, which is obtained by comparing the waveform b with the waveform d by means of the comparator CMP101, and then shaping the comparison result to a waveform by means of the comparator CMP101 and output circuit OC101.

On the other hand, as illustrated in FIG. 20, the conventional high-speed and highly-sensitive data. communication receiving element 101 is downsized by molding a photodiode chip 105 and a receiving IC chip 106 into the same resin. The data communication receiving element 101 includes broadband amplifiers AMP101 and AMP102 so as to operate at a high speed, and is able to detect a very minor input signal due to its high sensitivity.

However, in the conventional data communication receiving element 101 of FIG. 20, a coupling capacity cfb101 is generated across the input end including a wire WR101 and an input terminal $IN_{IC}101$, and the output end including a wire WR102 and the output terminal OUT101.

Thus, a feedback current ifb101 is generated by the coupling capacity cfb101 and a change in the output; voltage Vo101 on a proportional basis with respect to a lapse of time, and flows toward the input end from the output end. The feedback current ifb101 can be expressed as: $ifb101 = cfb101 \times dVo101/dt$, and becomes a noise component in the receiver, thereby deteriorating an S/N ratio given by a ratio of the signal component to the noise component (signal component/noise component). In particular, since the output voltage Vo101 is substantially a square pulse, its rising and falling edges are very sharp. Hence, $dVo101/dt$ takes a very large value, and the feedback current ifb101 increases accordingly.

The above phenomenon makes the transmission distance shorter, and moreover, causes an output of an unwanted error pulse or an oscillation, thereby posing a problem that the performance of the receiving system is degraded.

Also, since two comparators CMP102 and CMP103 are provided in the following stage of the comparator CMP101 as shown in FIG. 21, a generally adopted method allows the selection of either the positive-phase output voltage Vo101 or the anti-phase output voltage Vo101', whichever, is preferable.

However, in this method, when the load is connected to the positive-phase output terminal alone, the waveform of the positive-phase output voltage Vo101 varies with the distortion of the waveform caused by the connection with the load, but the waveform of the anti-phase output voltage Vo101' remains intact because it is not affected by the load.

Consequently, the waveform of the positive-phase output voltage Vo101 differs from the waveform of the anti-phase output voltage Vo101', which makes it difficult to obtain the anti-phase output voltage Vo101' having exactly the same waveform with respect to the positive-phase output voltage Vo101.

SUMMARY OF THE INVENTION

The present invention is devised to solve the above problems, and it is therefore an object of the present invention to provide a data communication receiving element which can suppress the deterioration of an S/N ratio caused by a coupling capacity generated across an input end and an output end and a change in an output voltage on a proportional basis with respect to a lapse of time as the operation speed and sensitivity are improved.

To fulfill the above and other objects, a first data communication receiving element of the present invention is furnished with:

a photo-receiving element for receiving a light signal sent from an external and converting the light signal to a current signal;

an amplifying circuit for amplifying the current signal after converting the current signal to a voltage signal;

a waveform shaping circuit for shaping an output voltage waveform from the amplifying circuit to a substantially square pulse to be outputted; and a waveform changing circuit for changing the substantially square pulse to a non-square pulse by extending a rising time necessary for shifting the substantially square pulse from a low potential level to a high potential level, and a falling time necessary for shifting the substantially square pulse from the high potential level to the low potential level.

According to the above arrangement, the substantially square pulse outputted from the waveform shaping circuit is inputted to the waveform changing circuit. In the substantially square pulse, the rising from the low potential level to the high potential level, and the falling from the high potential level to the low potential level occur instantaneously. Thus, the waveform changing circuit changes the substantially square pulse to the non-square pulse, so that the rising and falling take place in a longer period.

Thus, the rising time and falling time of the non-square pulse of the output voltage from the waveform changing circuit are extended, and the time differentials of the output voltage within the rising time and falling time become smaller.

Accordingly, a feedback current from the output end to the input end of the data communication receiving element caused during the rising time and falling time by a change in the voltage can be reduced, thereby suppressing the deterioration of the S/N ratio. As a consequence, the degradation of the performance of the data communication receiving element can be prevented.

The waveform changing circuit can be realized by, for example, an integrator composed of a capacitor, a charging/discharging circuit for charging/discharging the capacitor, and a voltage delivering circuit for delivering a voltage based on a voltage applied to the capacitor to the output terminal.

More specifically, the waveform changing circuit can be realized by, for example, an output circuit, in which the capacity is connected to the output of a differential amplifier of the current output type whose one input terminal is connected to a reference voltage and whose other input terminal receives an input signal, and the differential amplifier charges/discharges the capacity with an output current corresponding to a balance between the reference voltage and the above input signal. The resulting integral voltage waveform is then outputted through a buffer.

It is more preferable that the data communication receiving element is further furnished with a rising/falling time adjusting circuit for adjusting the rising time and falling time of the output waveform. The rising/falling time adjusting circuit can be arranged in such a manner that it adjusts the rising time and falling time in response to a value of the power source voltage. For example, the rising/falling time adjusting circuit can be arranged in such a manner that it shortens the rising time and falling time by increasing the current flowing through the differential amplifier when the power source voltage exceeds a pre-set value.

According to the above arrangement, a variance of the pulse width of the output voltage with a change ir the power source voltage can be suppressed. Consequently, a data communication receiving element. operable on an extensive range of the power source voltage can be realized without degrading the communication performance.

Also, to fulfill the above and other objects, a second data communication receiving element of thus present invention is characterized by being furnished with:

a photo-receiving element for receiving a light signal sent from an external and converting the light signal to a current signal;

an amplifying circuit for amplifying the current signal after converting the current signal to a voltage signal; and a waveform shaping circuit for shaping an output voltage waveform from the amplifying circuit to a substantially square pulse, wherein:

the waveform shaping circuit has two output terminals for outputting the substantially square pulse; and the waveform shaping circuit includes an anti-phase generating circuit for outputting the substantially square pulse outputted from one of the two output terminals after having inverted a phase of the substantially square pulse.

According to the above arrangement, the substantially square pulse outputted from the waveform shaping circuit is branched from the output terminal of the waveform shaping circuit and inputted to the anti-phase generating circuit. The anti-phase generating circuit outputs the substantially square pulse after it has inverted the phase thereof. Consequently, both the positive-phase and anti-phase of the substantially square pulse are outputted.

Thus, the feedback currents caused by a change in voltages at the positive-phase output terminal and anti-phase output terminal are applied in such a manner so as to cancel out with each other, thereby making it possible to reduce an overall feedback current. Also, even when the positive-phase output terminal is connected to the load and the waveform of the positive-phase output varies, the waveform of the anti-phase output varies as well. Thus, the effect of reducing an overall feedback current can also be maintained in this case.

Consequently, the deterioration of the S/N ratio of the data communication receiving element can be suppressed, and hence, the degradation of the performance of the data communication receiving element can be prevented.

For a fuller understanding of the nature and advantages of the invention, reference should be made to the ensuing detailed description taken in conjunction with the accompanying drawings.

DESCRIPTION OF THE EMBODIMENTS

Embodiment 1

Referring to FIGS. 1 through 7, the following description will describe a data communication receiving element in accordance with an example embodiment of the present invention.

Figure 1:
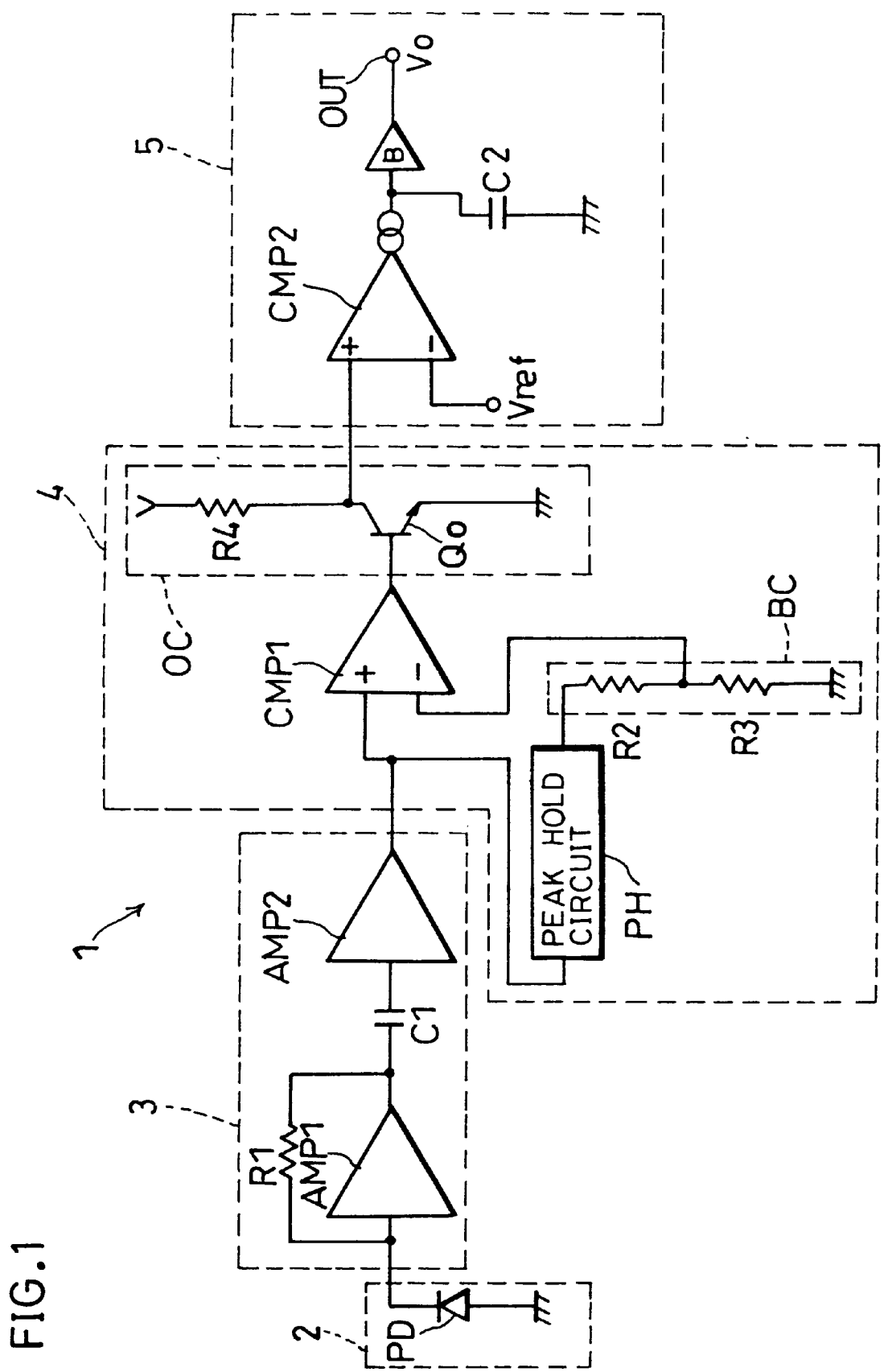
FIG. 1 is a block diagram depicting an arrangement of a data communication receiving element in accordance with an example embodiment of the present invention.

As shown in FIG. 1, a data communication receiving element 1 of the present embodiment basically comprises a photo-receiving section 2 for receiving a light signal, an amplifier circuit 3 for amplifying a received signal, a waveform shaping circuit 4 for shaping an amplified signal to a substantially square pulse, and an integrator for changing the substantially square pulse to a non-square pulse.

The data communication receiving element 1 suppresses the deterioration of the S/N ratio by reducing a feedback current from its output end to its input end by setting the rising time and falling time of the non-square pulse outputted from the integrator 5 to a predetermined time in the end.

The photo-receiving section 2 is composed of a photodiode PD serving as a photo-receiving element. The amplifier circuit 3 serving as amplifying means is composed of amplifiers AMP1 and AMP2 in two stages and a capacitor C1. The amplifier AMP1 in the first stage includes a feedback resistor R1.

The waveform shaping circuit 4 serving as waveform shaping means is composed of a peak hold circuit PH, a voltage dividing circuit BC, a comparator CMP1, and an output circuit OC. Further, the voltage dividing circuit BC is composed of resistors R2 and R3, and the output circuit OC is composed of an NPN-type output transistor Qo and a pull-up resistor R4.

The integrator 5 serving as waveform changing means is composed of a comparator CMP2 serving as charging/discharging means, a capacitor C2, and an output buffer B serving as voltage delivering means. Further, the integrator 5 has an output terminal OUT from which an output voltage Vo is outputted.

In the following, the connection of the above components will be explained.

The photodiode PD is grounded at its anode and connected to the input terminal of the amplifier AMP1 at its cathode. The output terminal of the amplifier AMP1 is connected to the input terminal of the amplifier AMP2 through the capacitor C1. In addition, the feedback resistor R1 is connected across the input terminal and output terminal of the amplifier AMP1.

The output terminal of the amplifier AMP2 is connected to the input terminal of the peak hold circuit PH and also to the non-inverting input terminal of the comparator CMP1. The output terminal of the peak hold circuit PH is connected to one end of the resistor R2 of the voltage dividing circuit BC. The resistors R2 and R3 of the voltage dividing circuit BC are connected in series, and one end of the resistor R3 is grounded. Also, the connecting point of the resistors R2 and R3 is connected to the inverting input terminal of the comparator CMP1.

In the output circuit OC, the base of the output transistor Qo is connected to the output terminal of the comparator CMP1, and the collector of the same is connected to one end of the pull-up resistor R4, while the emitter of the same is grounded. The other end of the pull-up resistor R4 is connected to the terminal of the power source.

In the integrator 5, the non-inverting input terminal of the comparator CMP2 is connected to the connecting point of the output transistor Qo and pull-up resistor R4, and the inverting input terminal of the same is connected to a terminal to which a reference voltage Vref is applied. One end of the capacitor C2 is connected to somewhere between the output terminal of the comparator CMP2 and the input terminal of the output buffer B, and the other end of the same is grounded. Also, the input terminal of the output buffer B is connected to the output terminal of the comparator CMP2. Here, the output terminal of the output buffer B also serves as the output terminal OUT of the integrator 5.

Next, the operation of the above-arranged data communication receiving element 1 will be explained in the following.

In the first place, the photodiode PD receives pulses of an infrared light signal sent from the external, and converts the same to an electrical signal (current) to be outputted. Then, the amplifier AMP1 amplifies an output current from the photodiode PD by converting the same to a voltage. Only a signal component of an output voltage from the amplifier AMP1 is allowed to pass through the capacitor C1 and amplified by the amplifier AMP2 in the following stage.

An output voltage from the amplifier AMP2 is inputted to both the peak hold circuit PH and the non-inverting input terminal of the comparator CMP1. The voltage inputted to the peak hold circuit PH is shaped into a voltage waveform with its voltage peak being maintained by an unillustrated capacitor enclosed in the peak hold circuit PH. The output voltage from the peak hold circuit PH is divided to a detection level in a predetermined ratio by the resistors R2 and R3 of the voltage dividing circuit BC, and inputted to the inverting input terminal of the comparator CMP1.

The comparator CMP1 compares the output voltage from the amplifier AMP2 with the detection level. When the former is higher than the latter, the comparator CMP1 generates a high-level voltage; otherwise, it generates a low-level voltage. Accordingly, a waveform of a squarewise pulse is shaped, and in the end, the output voltage from the amplifier AMP2 is shaped to a substantially square pulse.

The output transistor Qo of the output circuit OC switches ON/OFF in response to the output voltage from the comparator CMP1. In other words, the output transistor Qo stays ON while the comparator CMP1 keeps outputting a high-level output voltage, thereby maintaining the voltage at the output terminal of the output circuit OC in the low level. On the other hand, the output transistor Qo stays OFF while the comparator CMP1 keeps outputting a low-level output voltage, thereby maintaining the voltage at the output terminal of the output circuit OC in the high level due to the pull-up resistor R4 provided therein. Here, the voltage waveform outputted to the output terminal of the output circuit OC is substantially the perfect square pulse.

The voltage of the substantially square pulse is inputted to the non-inverting input terminal of the comparator CMP2, and compared with the reference voltage Vref applied to the inverting input terminal. The input voltage of the substantially square pulse remains below the reference voltage Vref while it stays in the low level. Thus, the capacitor C2 is in a discharge state. Under these conditions, the voltage stays in the low level and so does the output voltage Vo outputted through the output buffer B.

On the other hand, when the input voltage of the substantially square pulse exceeds the reference voltage Vref as it shifts to the high level from the low level, the charging of the capacitor C2 starts. Accordingly, a voltage applied to the capacitor C2 gradually rises from the low level to the certain high level. The output voltage Vo outputted through the output buffer B gradually shifts from the low level to the high level in response to a change in the voltage at the capacitor C2. A time necessary for the above change in the output voltage Vo is defined as the rising time Trise of the output voltage Vo.

While the input voltage of the substantially square pulse stays in the high level, a maximum voltage is kept applied to the capacitor C2, and output voltage Vo remains in the high level.

When the input voltage of the substantially square pulse drops below the reference voltage Vref later as it shifts to the low level from the high level, the capacitor C2 starts the discharging. Accordingly, the voltage applied to the capacitor C2 gradually drops to the low level from the high level, and so does the output voltage Vo outputted through the output buffer B in response to a change in the voltage at the capacitor C2. A time necessary for the above change in the output voltage Vo is defined as the falling time Tfall of the output voltage Vo.

Consequently, the output voltage Vo from the integrator 5 is shaped to a non-square pulse having the predetermined rising time Trise and falling time Tfall.

Figure 2:
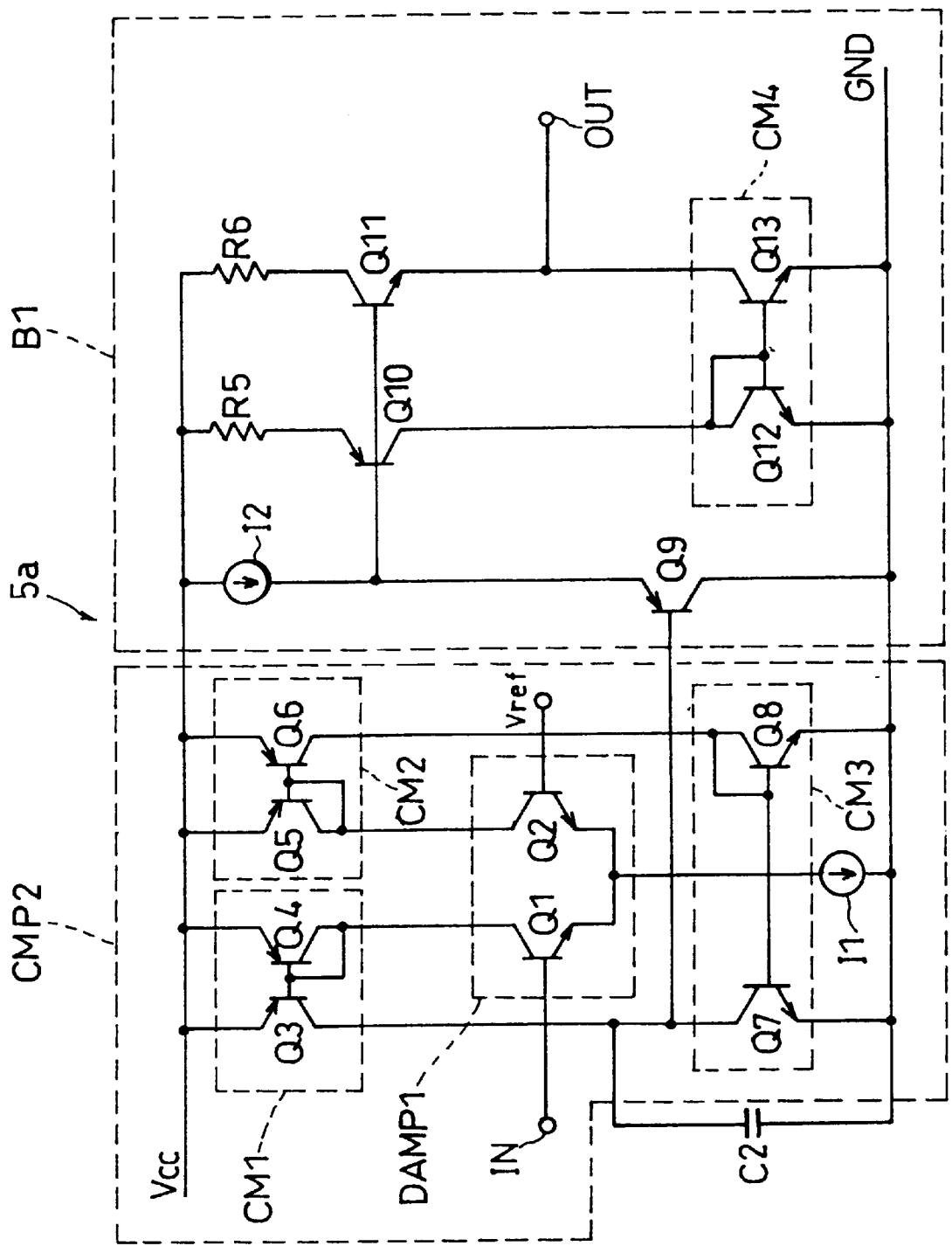
FIG. 2 is a circuit diagram depicting an arrangement of an example integrator in the data communication receiving element of FIG. 1.

Next, the correlation between the rising time Trise and falling time Tfall of the output voltage Vo with the characteristics of the data communication receiving element 1 will be explained with reference to FIG. 2 illustrating an example integrator 5.

An integrator 5a illustrated in FIG. 2 is composed of a comparator CMP2, a capacitor C2, and an output buffer B1.

The comparator CMP2 is composed of a differential amplifier DAMP1, current mirror circuits CM1, CM2, and CM3, and a constant current source I1.

The differential amplifier DAMP1 is composed of a pair of NPN-type transistors Q1 and Q2 whose emitters are connected to each other. The base of the transistor Q1 is connected to the non-inverting input terminal of the comparator CMP2, namely, the input terminal IN of the integrator 5a, while the collector of the same is connected to the collector of a transistor Q4 described below. The base of the transistor Q2 is connected to the inverting input terminal of the comparator CMP2, while the collector of the same is connected to the collector of a transistor Q5 described below.

The current mirror circuit CM1 is composed of a pair of PNP-type transistors Q3 and Q4 whose bases are connected to each other. The emitter of the transistor Q3 is connected to the terminal of the power source, and the collector of the same is connected to one end of the capacitor C2, the collector of a transistor Q7 described below, and the base of a transistor Q9 described below.

The emitter of the transistor Q4 is connected to the terminal of the power source, and the collector of the same is connected to its own base.

The current mirror circuit CM2 is composed of a pair of PNP-type transistors Q5 and Q6 whose bases are connected to each other. The emitter of the transistor Q5 is connected to the terminal of the power source, and the collector of the same is connected to its own base. The emitter of the transistor Q6 is connected to the terminal of the power source, and the collector of the same is connected to the collector of a transistor Q8 described below.

The current mirror circuit CM3 is composed of a pair of NPN-type transistors Q7 and Q8 whose bases are connected to each other. The emitter of the transistor Q7 is grounded. The collector of the transistor Q8 is connected to its own base, and the emitter of the same is grounded.

One end of the constant current source I1 is connected to the connecting point of the transistors Q1 and Q2, and the other end of the same is grounded.

One end of the capacitor C2 is connected to the connecting point of the aforementioned transistors Q3 and Q7, and the other end of the same is grounded.

Further, the output buffer Bi is composed of the transistors Q9, Q10, and Q11, resistors R5 and R6, a current mirror circuit CM4, and a constant current source I2.

The base of the transistor Q9 serves as the input terminal of the output buffer B1, and the emitter of the same is connected to one end of the constant current source I2, while the collector of the same is grounded. The other end of the constant current source I2 is connected to the terminal of the power source. The base of the transistor Q10 is connected to the connecting point of the transistor Q9 and constant current source I2, and the emitter of the same is connected to one end of the resistor R5, while the collector of the same is connected to the collector of a transistor Q12 described below. Also, the other end of the resistor R5 is connected to the terminal of the power source. The base of the transistor Q11 is connected to the connecting point of the transistor Q9 and constant current source I2, and the collector of the same is connected to one end of the resistor R6, while the emitter of the same is connected to both the output terminal OUT of the integrator 5a and the collector of a transistor Q13 described below. The other end of the resistor R6 is connected to the terminal of the power source.

The current mirror circuit CM4 is composed of a pair of NPN-type transistors Q12 and Q13 whose bases are connected to each other. The collector of the transistor Q12 is connected to its own base, while the emitter of the same is grounded. The emitter of the transistor Q13 is grounded.

Figure 5A:
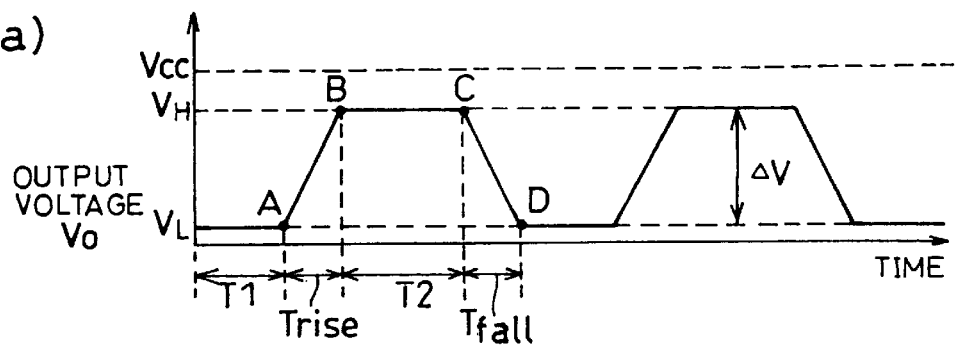
FIGS. 5(a) through 5(c) show the waveforms of the output voltages from the integrators of FIGS. 2 through 4, respectively.

The operation of the above-arranged integrator 5a will be explained with reference to FIG. 5(a) illustrating the waveform of the output voltage Vo.

The transistor Q1 stays OFF while its input terminal IN is receiving a low-level voltage of the substantially square pulse from the output circuit OC in the preceding stage to the integrator 5a. Thus, no current is allowed to flow through the current mirror circuit CM1. For this reason, the voltage applied to the capacitor C2 remains in the low level, and so does the base voltage of the transistor Q9. Here, the upper and lower limits of the base voltage of the transistor Q9 is controlled by an unillustrated clamp circuit, so that the transistor Q9 always stays ON. Also, since the base voltages of the transistors Q10 and Q11 are a sum of the base voltage of the transistor Q9 and a voltage across the base and emitter of the transistor Q9, the base voltages of the transistors Q10 and Q11 are in the low level.

Consequently, the transistor Q10 switches ON, while the base voltage of the transistor Q10, which is in effect a balance between the base voltage of the transistor Q11 and the voltage across the base and emitter of the same, is outputted from the emitter of the transistor Q11 to the output terminal OUT. Thus, the output voltage Vo is shifted to the low level, in other words, it becomes a voltage $V_L$ at the low potential level (period T1).

Subsequently, when the input voltage to the input terminal IN exceeds the reference voltage Vref as it shifts to the high level from the low level, a current, larger than the one flowing through the current mirror circuit CM2, starts to flow through the current mirror circuit CM1. Here, the collector currents of the transistors Q7 and Q8 of the current mirror circuit CM3 must be equal. Thus, a constant surplus current over time flows in the capacitor C2 from CM1, whereby the charging of the capacitor C2 is started (point A).

Then, the voltage applied to the capacitor C2 rises from the low level over time. Accordingly, the base voltage of the transistor Q10 gradually rises, and so does the output voltage Vo over time.

When the voltage applied to the capacitor C2 reaches its maximum level, the base voltages of the transistors Q10 and Q11 shift to the high level, whereupon the transistor Q10 switches OFF. Consequently, the high-level base voltage of the transistor Q9 becomes equal to the voltage at the output terminal OUT. Thus, the output voltage Vo shifts to the high level, in other words, becomes a voltage $V_H$ in a high potential level (point B). The time required for this process of shifting from the point A to the point B is defined as the rising time Trise.

The output voltage Vo is maintained at the voltage $V_H$ while the input voltage to the input terminal IN remains in the high level (period T2). Subsequently, when the output voltage Vo drops below the reference voltage Vref as the input voltage to the input terminal IN shifts to the low level from the high level, the current stops flowing through the current mirror circuit CM1, whereupon the capacitor C2 starts to discharge the charges charged therein (point C), and a constant current over time flows from the capacitor C2 and serves as a collector current of the transistor Q7. Thus, the voltage applied to the capacitor C2 drops over time from the maximum voltage to the low level.

During this process, the transistor Q10 switches ON when the capacitor C2 starts the discharging. Accordingly, the base voltage of the transistor Q10 drops as the voltage applied to the capacitor C2 drops, and the output voltage Vo drops to the voltage $V_L$ (point D) from the voltage $V_H$ (point C) over time. The time required for this process of shifting to the point D from the point C is defined as the falling time Tfall.

Consequently, the output voltage Vo from the integrator 5a is a trapezoidal pulse having the predetermined rising time Trise and falling time Tfall as illustrated in FIG. 5(a).

Here, let c3 be a capacity of the capacitor C2, $\Delta V$ be a difference between the high level and low level of the output voltage Vo from the integrator, and i1 be the current from the constant current source I1, then a relation expressed as:

$$\text{Trise} = \text{Tfall} = c3 \times \Delta V / i1 \quad (1)$$

is established. Thus, desired rising time Trise and falling time Tfall can be obtained by setting c3 and i1 at optimal values.

Also, since the data communication receiving element 1 is of the current input type, let a feedback current ifb be the feedback component from the output end to the input end, and cfb be a coupling capacity of the resin that molds the data communication receiving element 1, then a relation expressed as:

$$ifb = cfb \times dVo/d\text{Trise} = cfb \times dVo/d\text{Tfall} \quad (2)$$

is established.

Figure 6:
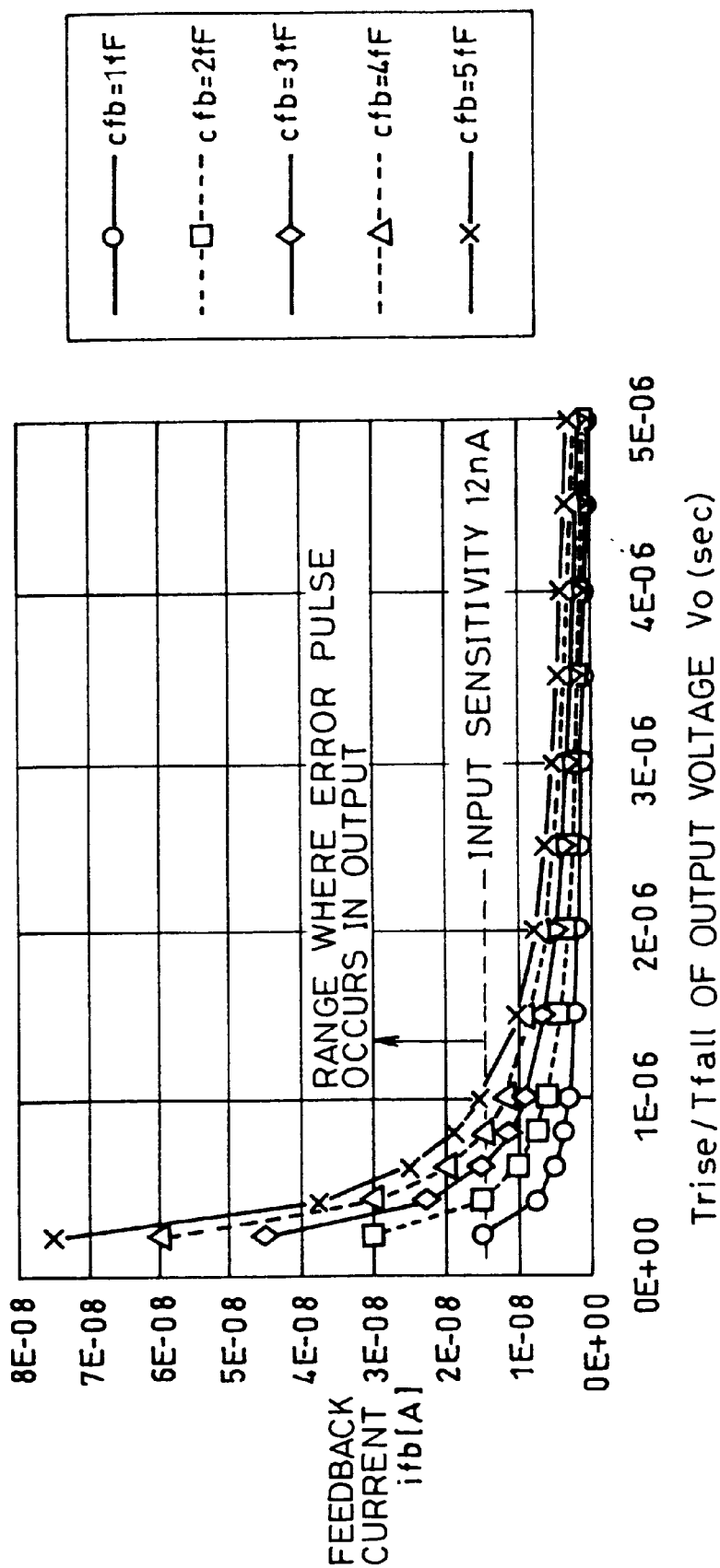
FIG. 6 is a graph showing a relation of the rising time and falling time of the output voltage versus a feedback current in the data communication receiving element of FIG. 1.

From Equations (1) and (2) above, the relation of the rising time Trise and falling time Tfall versus the feedback current ifb can be illustrated as the one in FIG. 6. Note that, however, the feedback current ifb is computed for each coupling capacity cfb, given that: Vo=3V (where the high-level output voltage is 3.5V and the low-level output voltage is 0.5V), the input sensitivity of the receiving IC is 12 nA, and a Gaussian random noise current is 1.6 nA.

The drawing reveals that the longer rising time Trise and falling time Tfall can reduce the feedback current ifb, that is, the noise component. Conversely, the shorter rising time Trise and falling time Tfall increases the feedback current ifb. In particular, in a region where the feedback current ifb exceeds the input sensitivity (12 nA) of the receiving IC, an unwanted error pulse is outputted.

Figure 7:
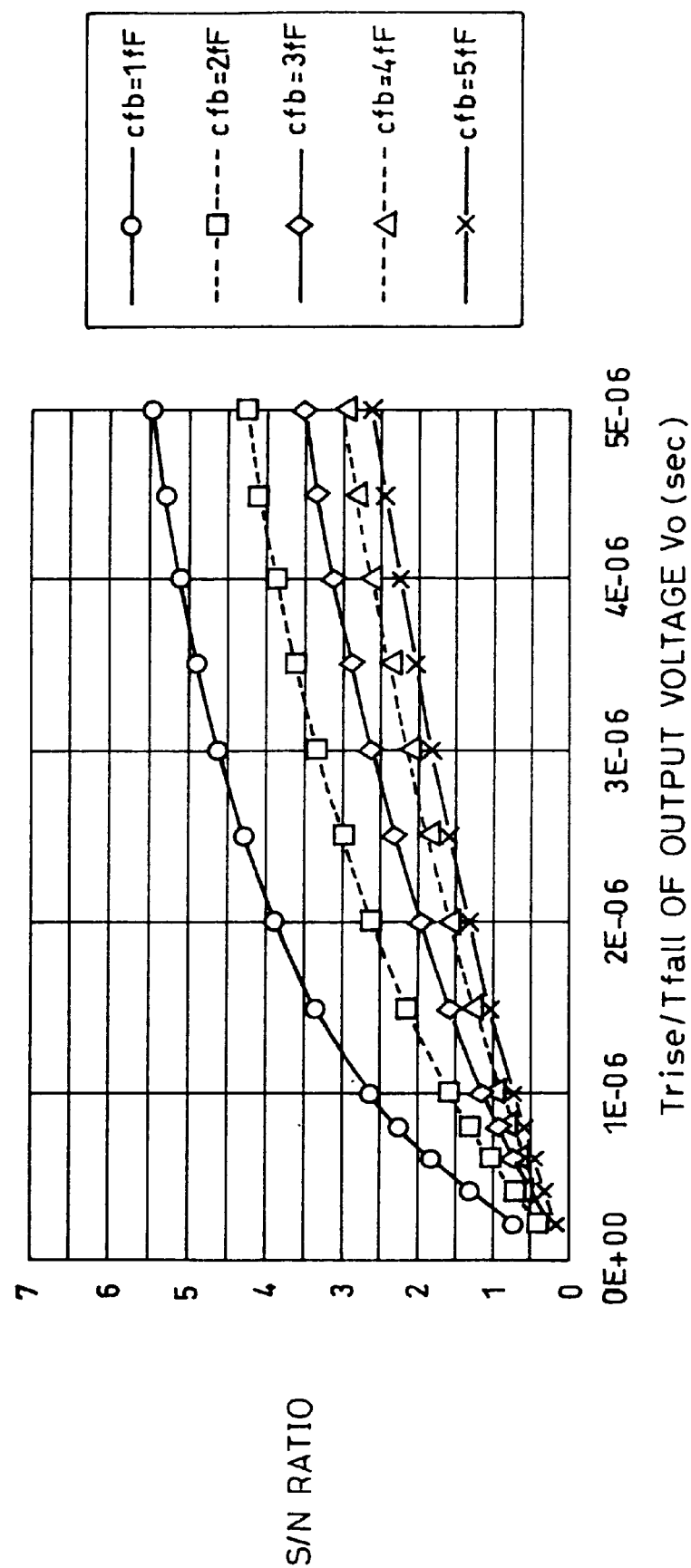
FIG. 7 is a graph showing a relation of the rising time and falling time of the output voltage versus an S/N ratio in the data communication receiving element of FIG. 1.

Also, the relation between the rising time Trise and falling time Tfall versus the S/N ratio is illustrated in FIG. 7. It can be understood from the drawing that the deterioration of the S/N ratio can be suppressed by extending the rising time Trise and falling time Tfall.

Figure 3:
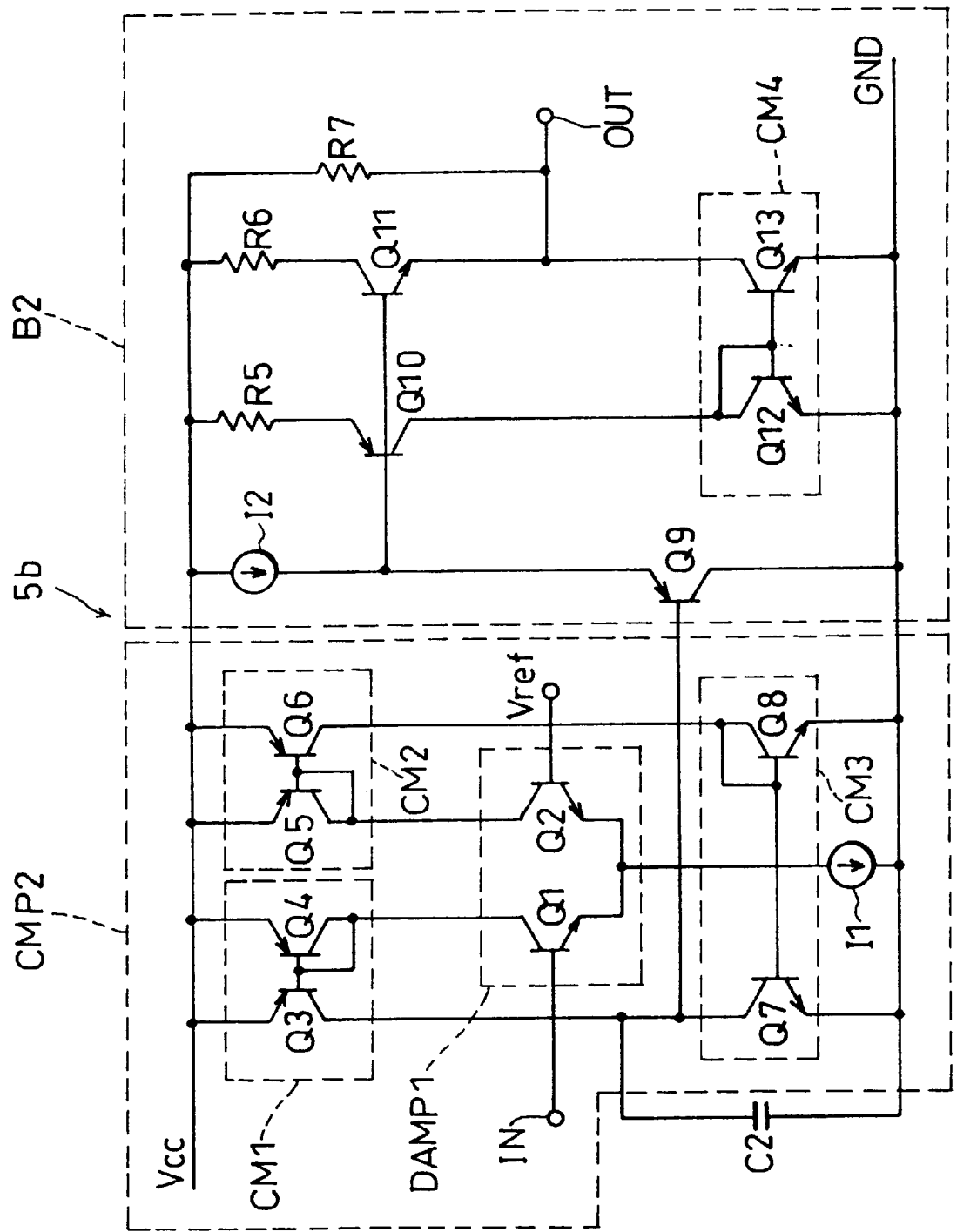
FIG. 3 is a circuit diagram depicting an arrangement of another example integrator in the data communication receiving element of FIG. 1.

Next, another example integrator 5 of FIG. 3 will be explained. An integrator 5b of the drawing is identical with the integrator 5a above except that the output buffer Bi is replaced with an output buffer B2, in which a pull-up resistor R7 serving as potential rising means is additionally provided somewhere between the terminal of the power source and the output terminal OUT.

Figure 5B:
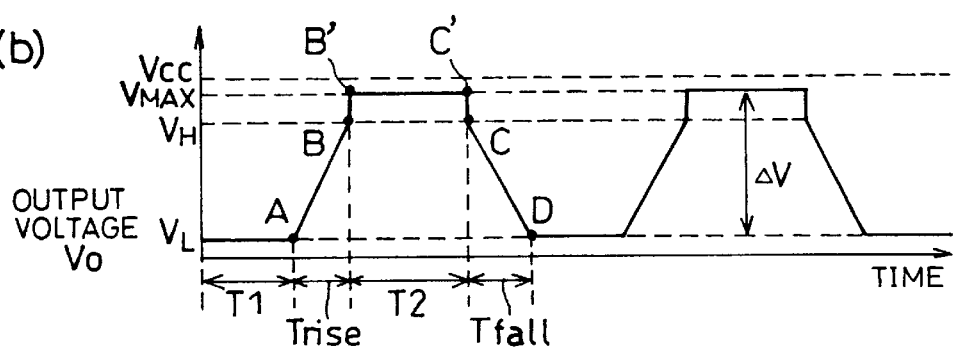

The operation of the above-arranged integrator 5b will be explained with reference to FIG. 5(b) illustrating the waveform of the output voltage Vo.

Like in case of the integrator 5a, the output voltage Vo from the integrator 5b is the voltage $V_L$ while the low-level voltage is inputted to the input terminal IN (period T1). As the input voltage to the input terminal IN shifts to the high level from the low level, the charging of the capacitor C2 starts (point A). The output voltage Vo rises on a proportional basis with respect to a lapse of time from the voltage $V_L$ to the voltage $V_H$ as the capacitor C2 is charged (rising time Trise)

The output voltage Vo rises to a voltage around the power source voltage Vcc due to the pull-up resistor R7, namely, to the voltage $V_{MAX}$ (point B') at the highest potential level, at the instance (point B) it becomes the voltage $V_H$, that is, when the charging of the capacitor C2 ends. The output voltage Vo is maintained at the voltage $V_{MAX}$ while the high-level voltage is inputted to the input terminal IN, that is, while the maximum voltage is kept applied to the capacitor C2 (period T2).

Then, the output voltage Vo drops to the voltage $V_H$ (point C) at the instance (point C') the capacitor C2 starts the discharging as the input voltage to the input terminal IN shifts from the high level to the low level. At the same time, the transistor Q10 switches ON, and like in the case of the integrator 5a, the output voltage Vo drops to the voltage $V_L$ from the voltage $V_H$ on a proportional basis with respect to a lapse of time (falling time Tfall).

Consequently, as shown in FIG. 5 (b), the output voltage Vo from the integrator 5b is shaped to pulses having the predetermined rising time Trise and falling time Tfall and the high level higher than that in the integrator 5a. In the drawing, the rising time Trise and falling time Tfall are equal to those for the integrator 5a, and the deterioration of the S/N ratio can be suppressed by setting these times to adequate values. Further, since the output voltage Vo is raised around the power source voltage Vcc by the pull-up resistor R7, a sufficient design margin can be secured for the digital circuit threshold level connected to the integrator 5b in the following stage.

Figure 4:
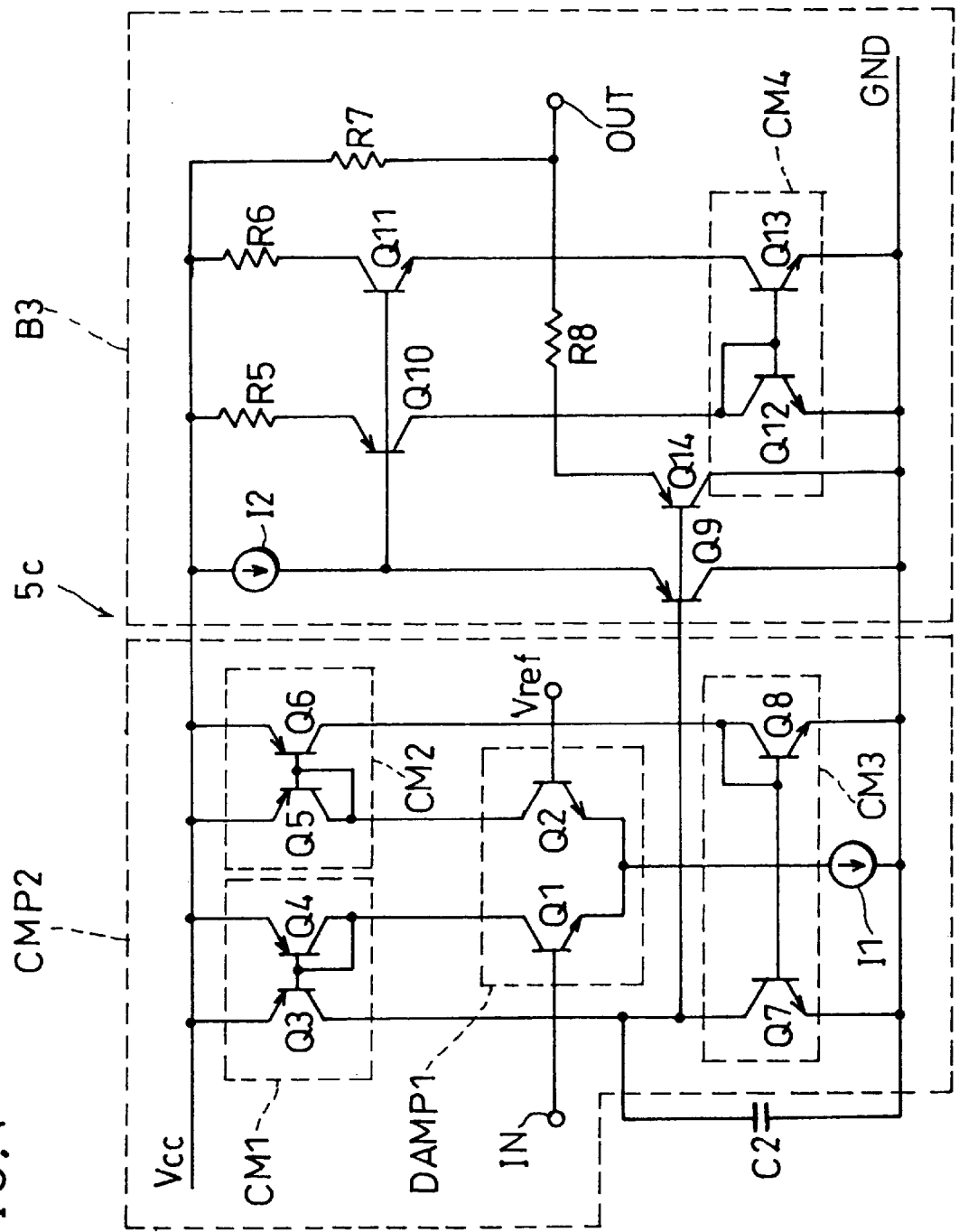
FIG. 4 is a circuit diagram depicting an arrangement of still another example integrator in the data communication receiving element of FIG. 1.

Still another example integrator 5 is illustrated in FIG. 4. An integrator 5c of FIG. 4 is identical with the integrator 5b explained above except that the output buffer B2 is replaced with an output buffer B3, in which a PNP-type transistor Q14 and a resistor R8 both serving as voltage varying rate changing means are additionally included.

The base of the transistor Q14 is connected to one end of the capacitor C2, and the emitter of the same is connected to one end of the resistor R8, while the collector of the same is grounded. The other end of the resistor R8 is connected to the output terminal OUT.

Figure 5C:
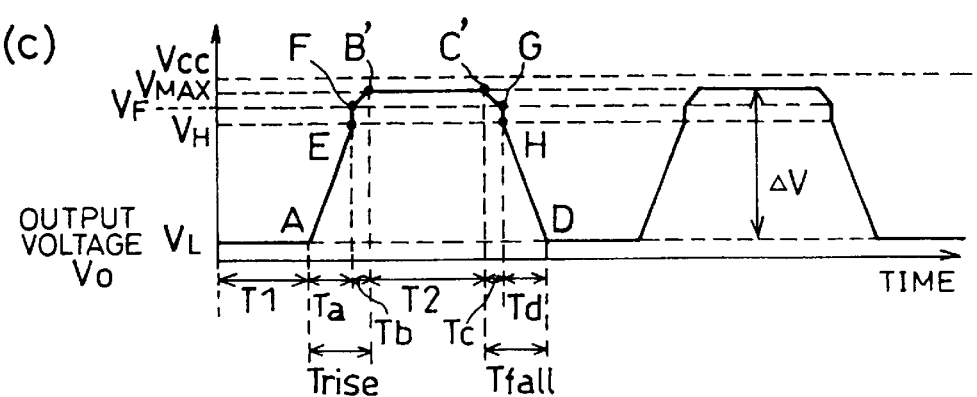

The operation of the above-arranged integrator 5c will be explained in the following with reference to FIG. 5(c) illustrating the waveform of the output voltage Vo.

Like the integrator 5b, the output voltage Vo from the integrator 5c is the voltage $V_L$ while a low-level voltage is inputted to the input terminal IN (period T1). The charging of the capacitor C2 starts when the input voltage to the input terminal IN shifts to the high level from the low level (point A). The output voltage Vo rises to the voltage $V_H$ from the voltage $V_L$ on a proportional basis with respect to a lapse of time as the capacitor C2 is charged further (period Ta).

Here, the output voltage Vo rises to the voltage $V_F$ (point F) due to the pull-up resistor R7 at the instance (point E), it reaches the voltage $V_H$. The transistor Q11 switches OFF at the point F, because the voltage $V_F$ exceeds the base voltage of the transistor Q11.

On the other hand, although the base voltage of the transistor Q14 is in the low level, the transistor Q14 stays OFF during the periods T1 and Ta, because its emitter is connected to the output through the resistor R8, and the emitter voltage and base voltage are substantially at the same potential in the low level. As the capacitor C2 is charged further, a potential difference is generated between the emitter and base of the transistor Q14 while the output voltage Vo is rising due to the resistor R7, whereupon the transistor Q14 switches ON and the emitter current starts to flow.

Here, the emitter current drops as the base voltage of the transistor Q14 gradually rises as the capacitor C2 is charged further. Thus, the output voltage Vo rises on a proportional basis with respect to a lapse of time (period Tb). The output voltage Vo reaches the voltage $V_{MAX}$ (point B') by the time the charging of the capacitor C2 ends. Hence, the rising time Trise of the integrator 5c is a sum of the periods Ta and Tb.

The output voltage Vo is maintained at the voltage $V_{MAX}$ while a high-level voltage is inputted to the input terminal IN, that is, while the maximum voltage is kept applied to the capacitor C2 (period T2). Then, the capacitor C2 starts the discharging when the input voltage to the input terminal IN shifts to the low level from the high level. Accordingly, the emitter current of the transistor Q14 increases at the instance (point C') the base voltage of the transistor Q14 starts to drop, whereupon the output voltage Vo starts to drop on a proportional basis with respect to a lapse of time (period Tc).

When the output voltage Vo drops to the voltage $V_F$ (point G), the transistor Q11 switches ON, whereupon the output voltage Vo drops to the voltage $V_H$ (point H). Accordingly, the transistor Q10 switches ON, and the output voltage Vo starts to drop to the voltage $V_L$ (point D) from the voltage $V_H$ on a proportional basis with respect to a lapse of time (period Td). Thus, the falling time Tfall of the integrator 5c is a sum of the periods Tc and Td.

Consequently, the output voltage Vo from the integrator 5c is the pulse whose voltage varying rate changes as shown in FIG. 5(c). In the drawing, since the rising time Trise and falling time Tfall are the period, during which the capacitor C2 is charged/discharged, they are equal to the rising time Trise and falling time Tfall of the integrator 5b. Here, a time necessary for the shifting from the point B to the point B' of FIG. 5(b) is not 0 (zero), but finite. The same can be said about a time necessary for the shifting from the point E to the point F of FIG. 5(c). Also, the time necessary for the shifting from the point E to the point B' in the integrator 5c is longer than the time necessary for the shifting from the point B to the point B' in the integrator 5b.

Thus, dVo/dTrise and dVo/dTfall are smaller in the integrator 5c than in the integrator 5b. Hence, the feedback current ifb to the input end of the data communication receiving element 1 can be reduced by Equation (2). Consequently, when the integrator 5c is provided, the effect of suppressing the deterioration of the S/N ratio is greater than the case of providing the integrator 5b. Further, like in the integrator 5b, the output voltage Vo is raised around the power source voltage Vcc by the pull-up resistor R7, a sufficient design margin can be secured for the digital circuit threshold level connected to the integrator 5c in the following stage.

As has been explained, the data communication receiving element 1 of the present embodiment is furnished with the integrator 5 (5a, 5b, or 5c), so as to extend the rising time Trise and falling time Tfall of the output voltage Vo from a predetermined time. Thus, it has become possible to reduce the feedback current ifb, prevent the output of an unwanted error pulse, and suppress the deterioration of the S/N ratio. In other words, the deterioration of characteristics caused by improving the operation speed and sensitivity of the data communication receiving element 1 can be suppressed.

Embodiment 2

Referring to FIGS. 8 through 13, the following description will describe another example embodiment of the present invention. Hereinafter, like components are labeled with like reference numerals with respect to Embodiment 1, and the description of these components is not repeated for the explanation's convenience.

Figure 8:
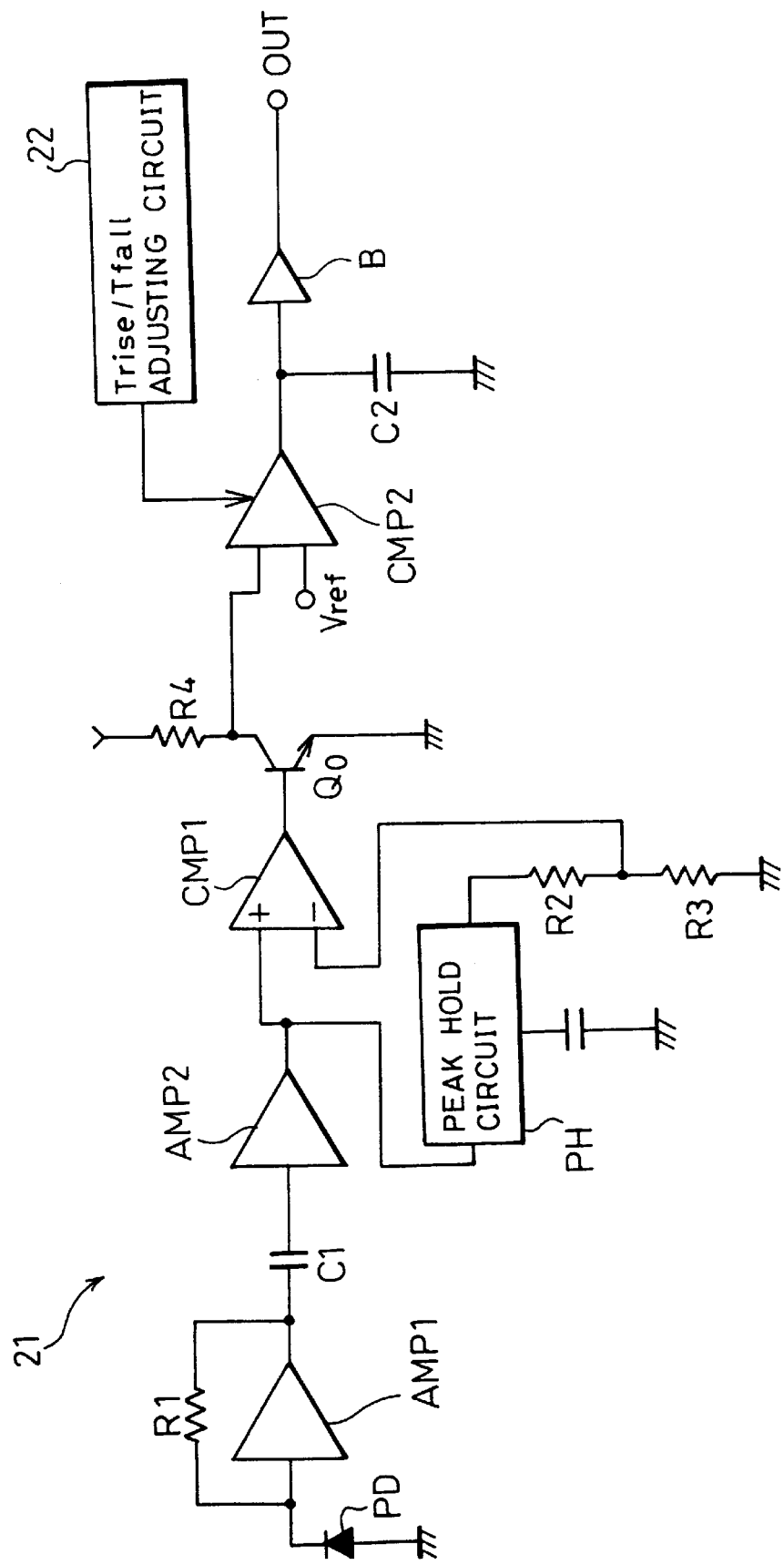
FIG. 8 is a block diagram depicting an arrangement of a data communication receiving element in accordance with another example embodiment of the present invention.

FIG. 8 is a block diagram depicting an arrangement of a data communication receiving element 21 of the present embodiment. The data communication receiving element 21 is identical with the data communication receiving element 1 of Embodiment 1 above except that it additionally includes a Trise/Tfall (rising/falling time) adjusting circuit 22 in the output circuit section.

The Trise/Tfall adjusting circuit 22 has a function for increasing a current in the comparator CMP2 (differential amplifier) when the power source voltage Vcc exceeds a predetermined voltage, so that the rising time/falling time of an output signal is shortened.

In case of the data communication receiving element 1 of Embodiment 1 above, the current used for a charging/discharging the capacitor C2 is fixed to a constant level by the constant power source I1. Thus, there occurs an inconvenience that the output pulse width of the integrator 5 becomes shorter when the power source voltage Vcc rises and the high-level output voltage rises higher. Thus, when the pulses are outputted in series, the high-level output voltage and low-level output voltage may not be outputted normally.

An output from the infrared communication element like the data communication receiving element 1 is generally connected to a microcomputer (digitally). The microcomputer holds specifications for input conditions for a threshold voltage used to distinguish the high level from the low level. Thus, in the above case, the output voltage can not satisfy the conditions, and the microcomputer becomes unable to distinguish the high level from the low level. Hence, the system may not operate normally.

Figure 9:
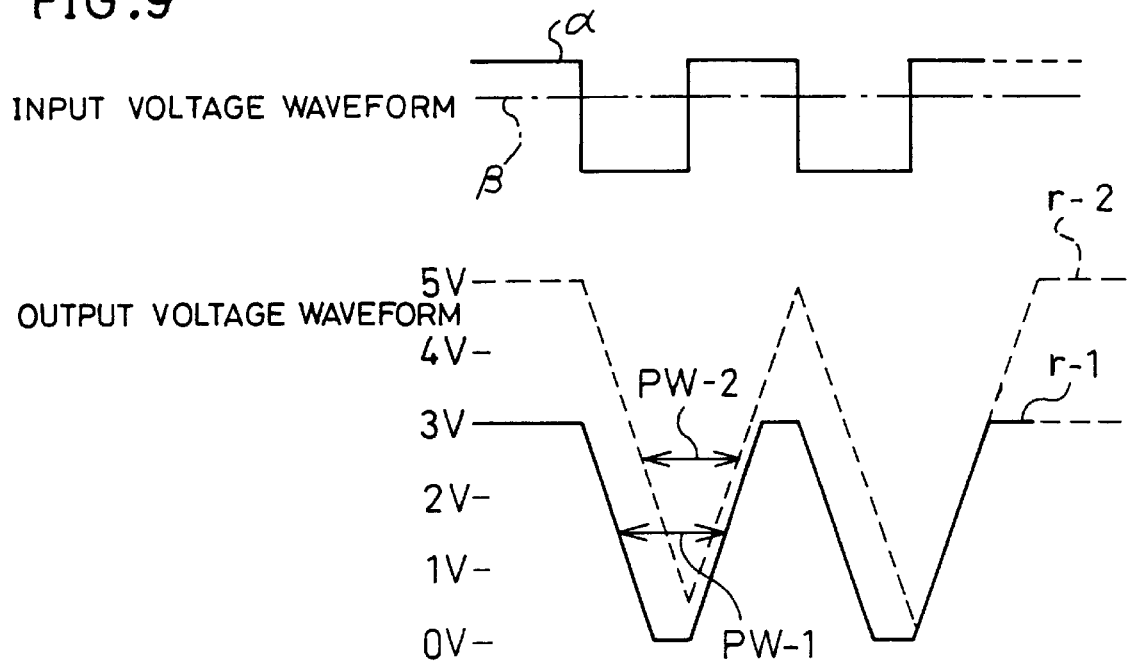
FIG. 9 is a view explaining an example case where a pulse width of an output voltage varies with a change in a power source voltage.

The above problem will be explained with reference to FIG. 9. In the drawing, α represents a waveform of an input signal to the comparator CMP2, and β represents a waveform of the reference voltage Vref; γ-1 represents a waveform of an output voltage from the integrator 5 when the power source voltage Vcc is 3V (low power source voltage), and γ-2 represents a waveform of an output voltage from the integrator 5 when the power source voltage is 5V (high power source voltage). As the drawing reveals, the pulse width PW-2 of the high power source output voltage is considerably narrow compared with the pulse width PW-1 of the low power source output voltage.

As has been explained, as the pulse width varies with a change in the power source voltage Vcc, the communication performance is deteriorated, thereby limiting a range of the power source voltage Vcc on which the infrared communication element can operate.

To solve the above problem, the data communication receiving element 21 of the present embodiment is furnished with the Trise/Tfall adjusting circuit 22, so that the variance of the pulse width of the output voltage with a change in the power source voltage Vcc can be suppressed. This arrangement can realize an infrared communication element operable on an extensive range of the power source voltage Vcc without degrading the communication performance.

In the following, the arrangement and operation of the Trise/Tfall adjusting circuit 22 will be explained.

Figure 10:
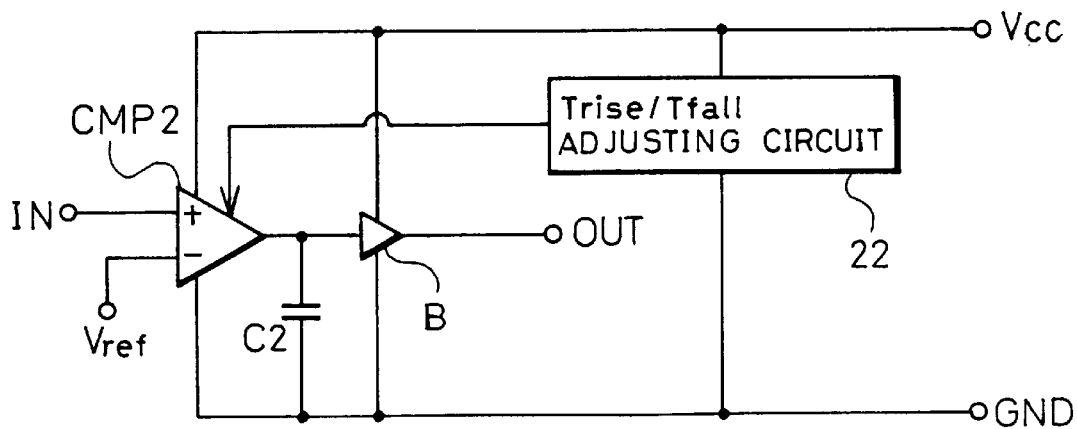
FIG. 10 is a block diagram depicting an arrangement of an output circuit section in the data communication receiving element of FIG. 8.
Figure 11:
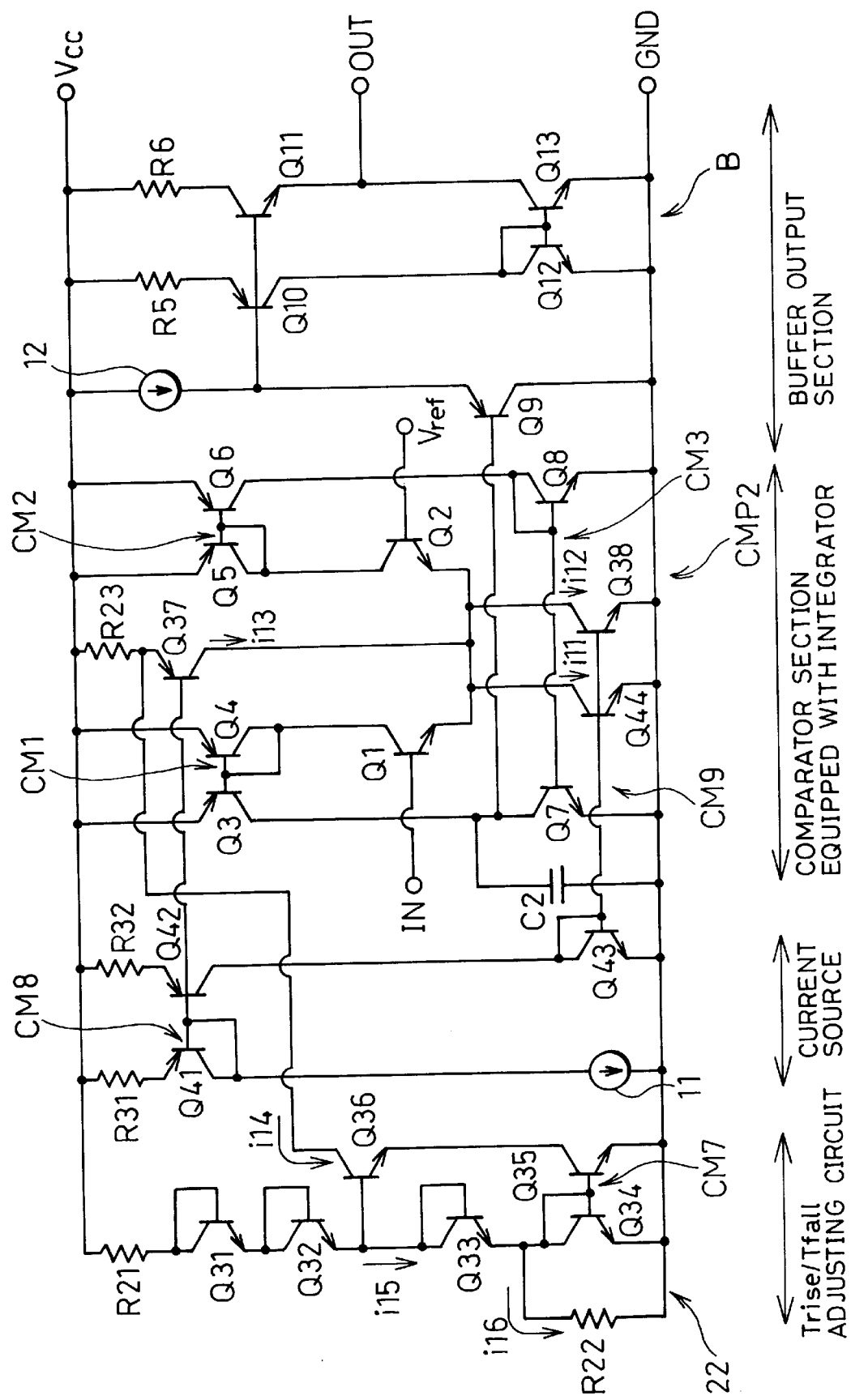
FIG. 11 is a circuit diagram depicting an arrangement of an output circuit section in the data communication receiving element of FIG. 8.

FIG. 10 is a block diagram depicting an arrangement of the output circuit section of the data communication receiving element 21, and FIG. 11 is a detailed circuit diagram of the output circuit section. As shown in FIG. 11, the comparator CMP2 is composed of transistors Q1–Q8 and a transistor Q44.

Assume that the transistor Q44 is equivalent to the constant current source I1 of FIG. 2, then a portion formed by the transistors Q1–Q8 and capacitor C2 is equivalent to the data communication receiving element 1 except that a current source for the transistor Q37 and Q38 is additionally provided. Note that the transistors Q37 and Q38 are the components forming the Trise/Tfall adjusting circuit 22.

As shown in FIG. 11, an output buffer B of the data communication receiving element 21 is arranged in the same manner as the output buffer Bi of FIG. 2, and like components are labeled with like numeral references. The Trise/Tfall adjusting circuit 22 is composed of the transistors Q31–Q38 and resistors R21–R23.

Also, the data communication receiving element 21 includes transistors Q41–Q43, resistors R31 and R32, and the constant current source I1.

Like in the arrangement of FIG. 2, the transistors Q3 and Q4 form the current mirror circuit CM1; the transistors Q5 and Q6 form the current mirror circuit CM2; and the transistors Q7 and Q8 form the current mirror circuit CM3. Also, in the data communication receiving element 21, the transistors Q34 and Q35 of the Trise/Tfall adjusting circuit 22 form a current mirror circuit CM7; the transistors Q41 and Q42 of the current source form a current mirror circuit CM8; and the transistors Q43 and Q44 form a current mirror circuit CM9.

In the above circuit arrangement, the two transistors Q37 and Q38 in the Trise/Tfall adjusting circuit 22 respectively supply current values i12 and i13, each of which is same as the current i11 of the transistor current source Q44. In short, the relation expressed as i11=i12=i13 is established. Thus, the current values i12 and i13 generally cancel out with each other, and the comparator CMP2 operates on the current i11 alone. Hence, the rising time Trise and falling time Tfall of the output can be expressed as:

$$\text{Trise} = \text{Tfall} = (C2 \times \Delta V)/i11 \qquad (3)$$

where the charging time/discharging time of the comparator CMP2=rising time/falling time of the output, and the charging current of the comparator CMP2 discharging current of the comparator CMP2 i11.

As shown in FIG. 11, the emitter of the transistor Q37 is connected to the collector of the transistor Q36, so that the current i14 starts to flow in the transistor Q36 when the power source voltage exceeds the predetermined voltage Von. Further, and the voltage ($V_{BE}$) across the base and emitter of the transistor Q37 is compressed by a voltage drop caused by the current i14 and the resistor R23 connected to the emitter of the transistor Q37, thereby reducing the current i13.

Consequently, the relation of i12=i13 is imbalanced to i12>i13, and the rising time Trise and falling time Tfall of the output when the power source voltage exceeds the voltage Von can be expressed as:

$$\text{Trise}=\text{Tfall}=(C2\times\Delta V)/(i11+i12-i13) \quad (4).$$

The comparison between Equations (3) and (4) above reveals that the current value of the comparator CMP2 corresponding to the denominator is greater in Equation (4) above than in Equation (3) above.

Thus, the rising time Trise and falling time Tfall of the output come earlier in Equation (4) as compared with those in Equation (3).

Figure 12:
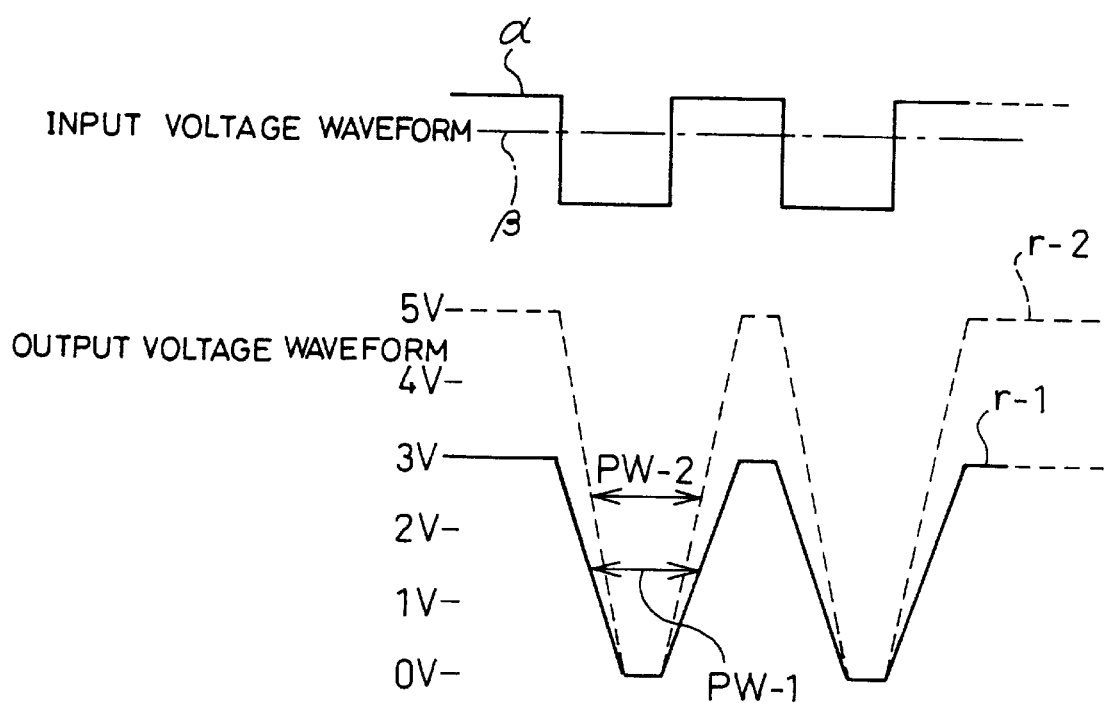
FIG. 12 is a view explaining an example case where a pulse width of the output voltage does not vary with a change in the power source voltage in the data communication receiving element of FIG. 8.

Thus, according to the data communication receiving element 21 of the present embodiment, as the waveform in FIG. 12 shows, when the power source voltage Vcc rises, the output time Trise and falling time Tfall of the output are shortened by the Trise/Tfall adjusting circuit 22. In other words, the waveform is adjusted to have a steep slope, so that the pulse width as wide as the one outputted on the low power source voltage can be outputted. In FIG. 12, α represents a waveform of an input signal to the comparator CMP2, and β represents a waveform of the reference voltage Vref; γ-1 represents a waveform of an output voltage from the data communication receiving element 21 when the power source voltage Vcc is 3V (low power source voltage), and γ-2 represents a waveform of an output voltage from the data communication receiving element 21 when the power source voltage is 5V (high power source voltage).

The aforementioned predetermined voltage Von can be expressed by Equation (5) below with the reference to the circuit arrangement shown in FIG. 11:

$$Von=3V_{BE}+(R21+R22)\times V_{BE}/R22 \quad (5)$$

where $3V_{BE}=V_{BE}(Q31)+V_{BE}(Q32)+V_{BE}(Q33)$.

Given $V_{BE}=0.7V$, R21=70 kΩ, and R22=30 kΩ, then Von=approx. 4.4V. Thus, when the power source voltage Vcc exceeds 4.4V, the Trise/Tfall adjusting circuit 22 starts to operate.

Next, the current i14 flowing through the transistor Q36 to switch ON the current i13 is expressed by Equation (6) below, and the currents i15 and i16 in Equation (6) below are expressed by Equations (7) and (8) below, respectively:

$$i14=i15=i16 \quad (6)$$

$$i15=(Vcc-4V_{BE})/R21 \quad (7)$$

$$i16=V_{BE}/R22 \quad (8).$$

Figure 13:
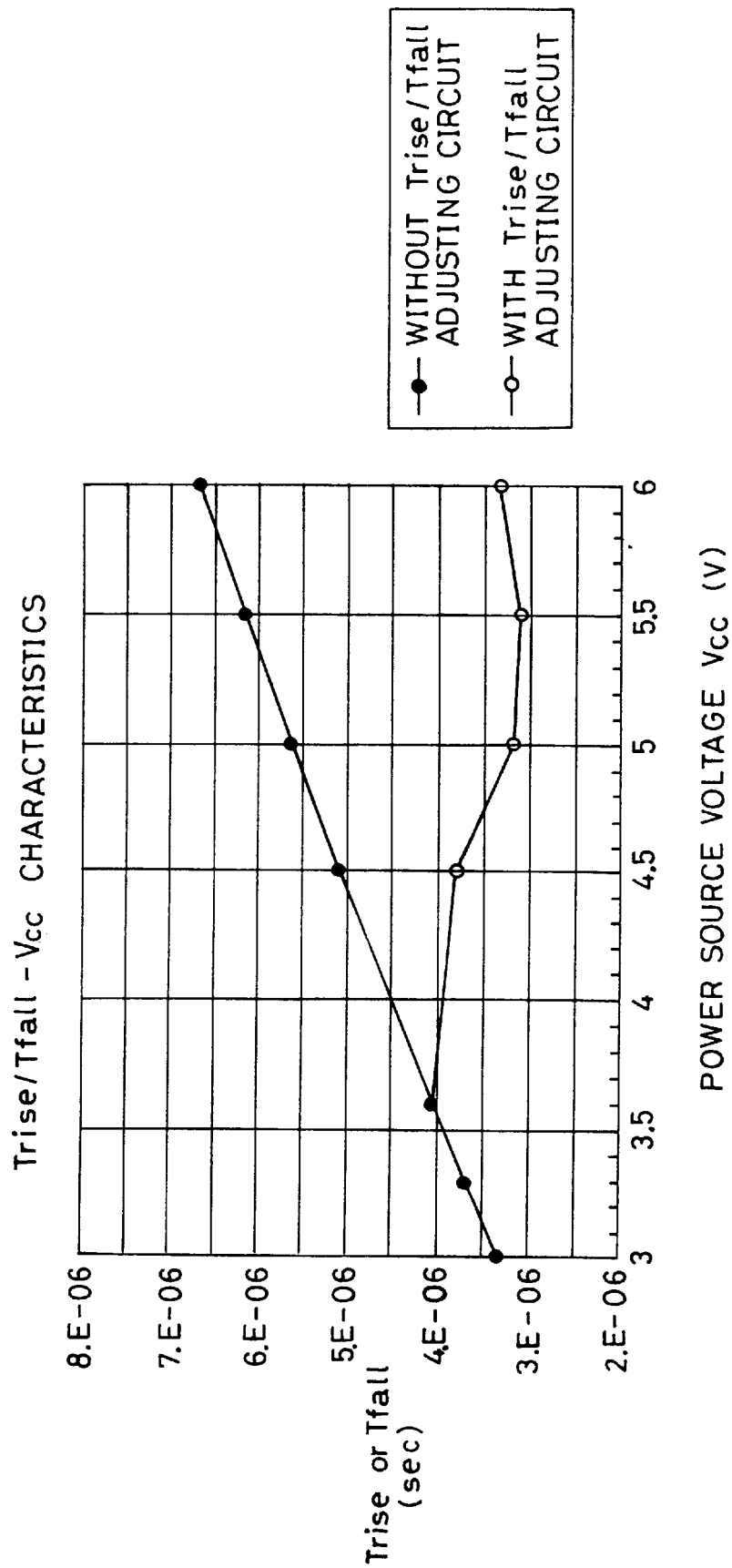
FIG. 13 is a graph showing the simulation result of the dependency characteristics on the power source voltage of the rising time and falling time of an output in case that a rising/falling time adjusting circuit is provided and in case that the same is not provided.

FIG. 13 shows the simulation results of the dependency characteristics on the power source voltage of the rising time Trise and falling time Tfall of the output in case that the Trise/Tfall adjusting circuit 22 is provided and in case that it is not provided. As shown in the drawing, when the Trise/Tfall adjusting circuit 22 is not provided, the rising time Trise and falling time Tfall of the output is extended (delayed) proportionally with the rise in the power source voltage Vcc because the charging/discharging current of the integrator is constant. On the other hand, when the Trise/Tfall adjusting circuit 22 is provided, since the charging/discharging current of the comparator CMP2 is varied with a change in the power source voltage Vcc as described above, the rising time Trise and falling time Tfall can be substantially constant regardless of a change in the power source voltage Vcc.

Thus, according to the data communication receiving element 21, since the Trise/Tfall adjusting circuit 22 suppresses the variance of the pulse width with a change in the power source voltage Vcc, an infrared communication element operable on an extensive range of the power source voltage Vcc can be provided without degrading the communication performance.

Embodiment 3

Referring to FIGS. 14 through 17, the following description will describe a data communication receiving element in accordance with still another example embodiment of the present invention. Hereinafter, like components are labeled with like reference numerals with respect to Embodiment 1 above, these components is not repeated for the explanation's convenience.

Figure 14:
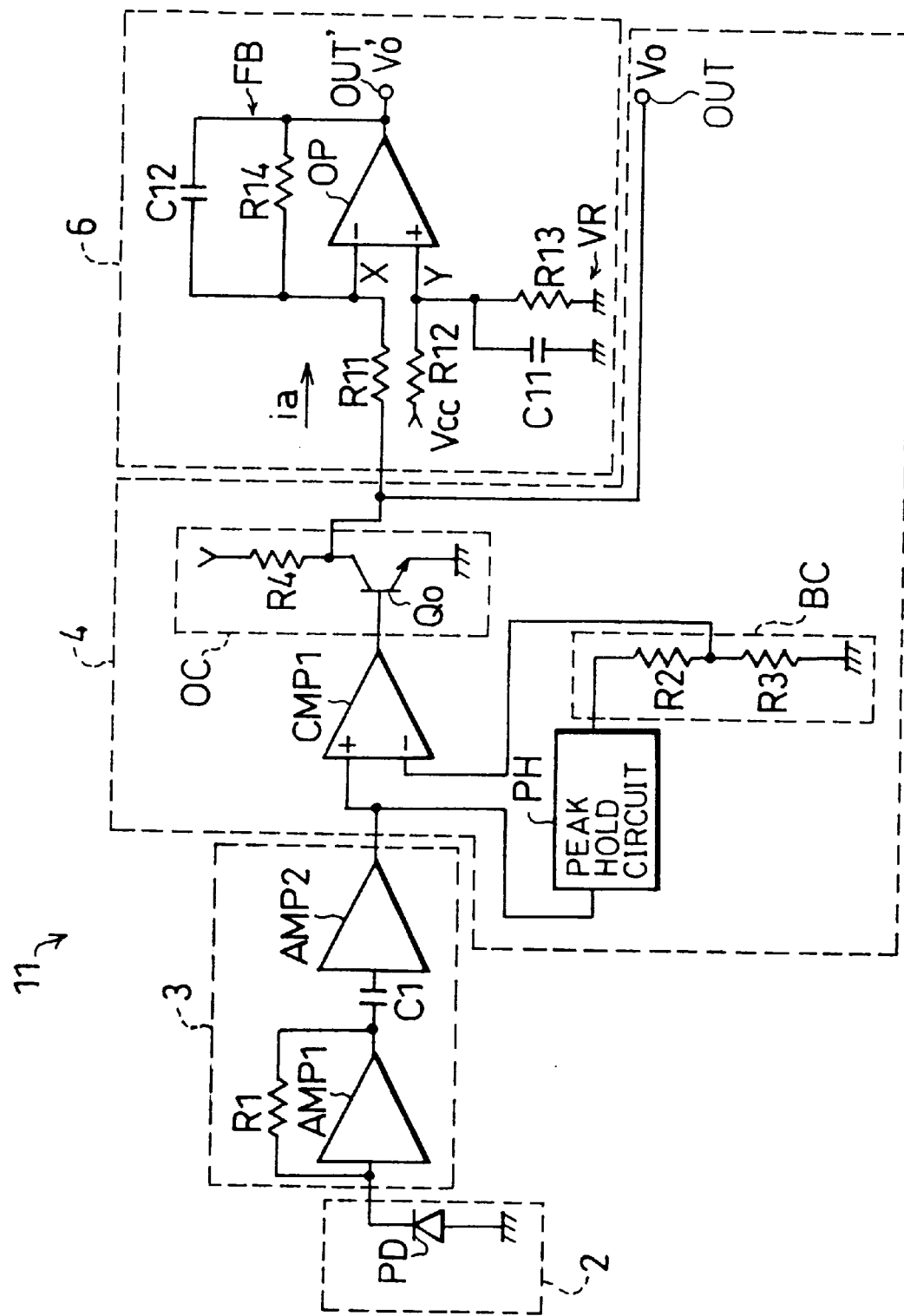
FIG. 14 is a block diagram depicting an arrangement of a data communication receiving element in accordance with still another example embodiment of the present invention.

As shown in FIG. 14, a data communication receiving element 11 of the present embodiment is arranged to include the photo-receiving section 2, amplifier circuit 3, and waveform shaping circuit 4 of Embodiment 1, and additionally an anti-phase generating circuit 6 which is connected to the output terminal of the output circuit OC in parallel.

Figure 15:
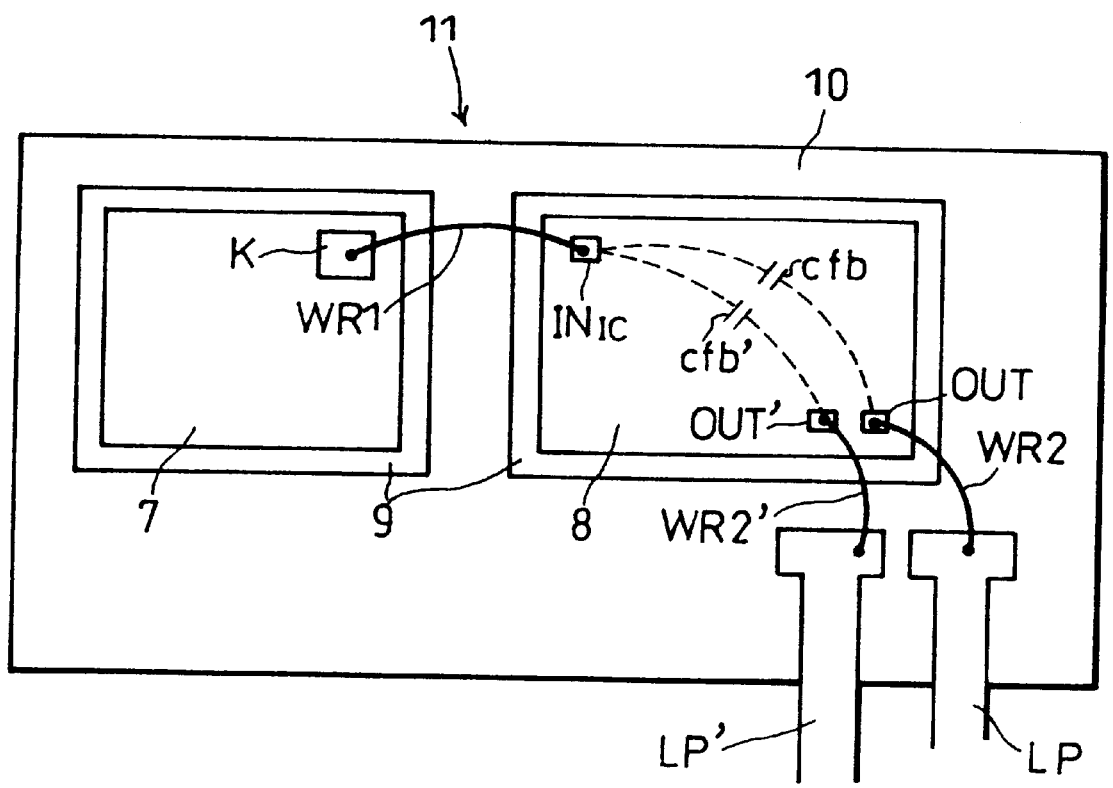
FIG. 15 is a view showing a package arrangement of the data communication receiving element of FIG. 14.

Also, the data communication receiving element 11 is characterized by its package arrangement as shown in FIG. 15. In other words, the positive-phase output voltage Vo and anti-phase output voltage Vo' are respectively taken out from the wires WR2 and WR2' bonded in parallel to each other, while providing their respective output terminals OUT and OUT' adjacently.

According to the above arrangement, the data communication receiving element 11 suppresses the deterioration of the S/N ratio by cancelling out the feedback currents of the positive-phase output and anti-phase output from the output end to the input end.

In the following, the data communication receiving element 11 will be explained in detail.

The anti-phase generating circuit 6 serving as anti-phase generating means is basically composed of an operational amplifier OP, a feedback circuit FB, an input resistor R11, a reference voltage generating circuit VR, and an output terminal OUT'.

The feedback circuit FB is composed of a feedback resistor R14 and a phase compensation capacitor C12 which are connected in parallel somewhere between the inverting input terminal and output terminal of the operational amplifier OP. One end of the input resistor R11 is connected to the output terminal of the output circuit OC, and the other end of the same is connected to the inverting input terminal of the operational amplifier OP.

The reference voltage generating circuit VR is composed of resistors R12 and R13 to divide the power source voltage Vcc in a predetermined ratio, and a capacitor C11 for impedance matching. The resistors R12 and R13 are connected in series, and one end of the resistor R12 is connected to the terminal of the power source, and one end of the resistor R13 is grounded. The connecting point of the resistors R12 and R13 is connected to the non-inverting input terminal of the operational amplifier OP. The capacitor C11 is connected to the resistor R13 in parallel, and grounded at one end. The output terminal of the operational amplifier OP also serves as the output terminal OUT' of the anti-phase generating circuit 6.

In short, the anti-phase generating circuit 6 is realized by an inverting amplifier.

In the following, a process as to how the anti-phase is generated by the anti-phase generating circuit 6 will be explained.

A current ia starts to flow through the input resistor R11 when a high-level voltage is inputted to the input terminal of the anti-phase generating circuit 6 from the output circuit OC. The current ia is expressed as: ia=(Vin−$V_X$)/r11, where Vin is the input voltage to the anti-phase generating circuit 6, $V_X$ is a voltage at the point X, and ni1 is a resistance value of the input resistor R11.

Given $V_Y$ as a voltage at the point Y, then $V_X$=$V_Y$ in the operational amplifier OP, and the entire current ia flows into the output terminal OUT' through the feedback resistor R14. Thus, given r14 as a resistance value of the feedback resistor R14, the feedback resistor R14 causes a voltage drop of ia×r14, thereby shifting the output voltage Vo' at the output terminal OUT' to the low level.

Conversely, when a low-level voltage is inputted to the input terminal of the anti-phase generating circuit 6, the feedback resistor R14 causes a voltage rise of ia×r14, thereby shifting the output voltage Vo' to the high level.

Thus, the input voltage Vin is outputted as the anti-phase output voltage Vo' by the anti-phase generating circuit 6.

Figure 17:
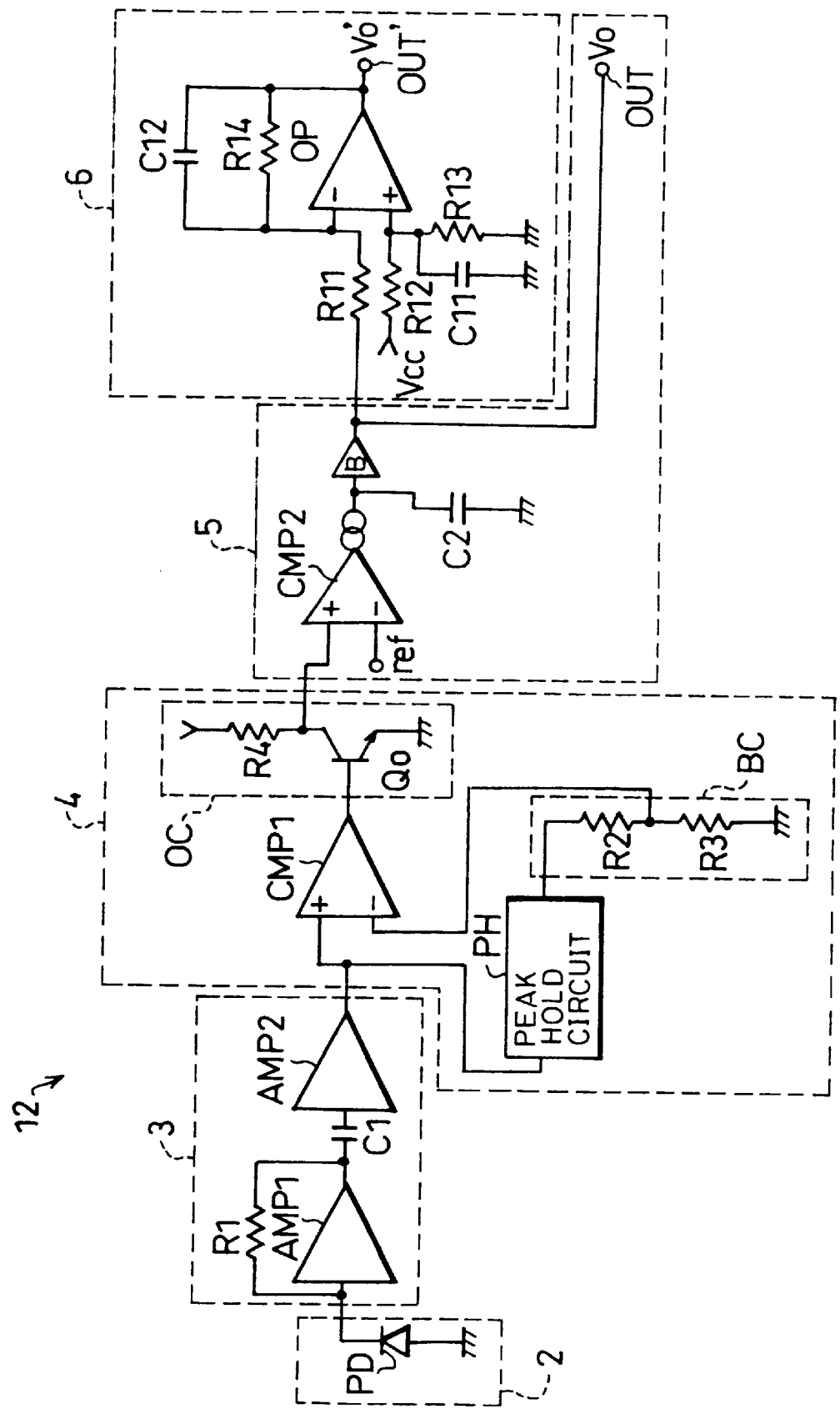
FIG. 17 is a block diagram depicting an arrangement of a data communication receiving element in accordance with still another embodiment.
Figure 18:
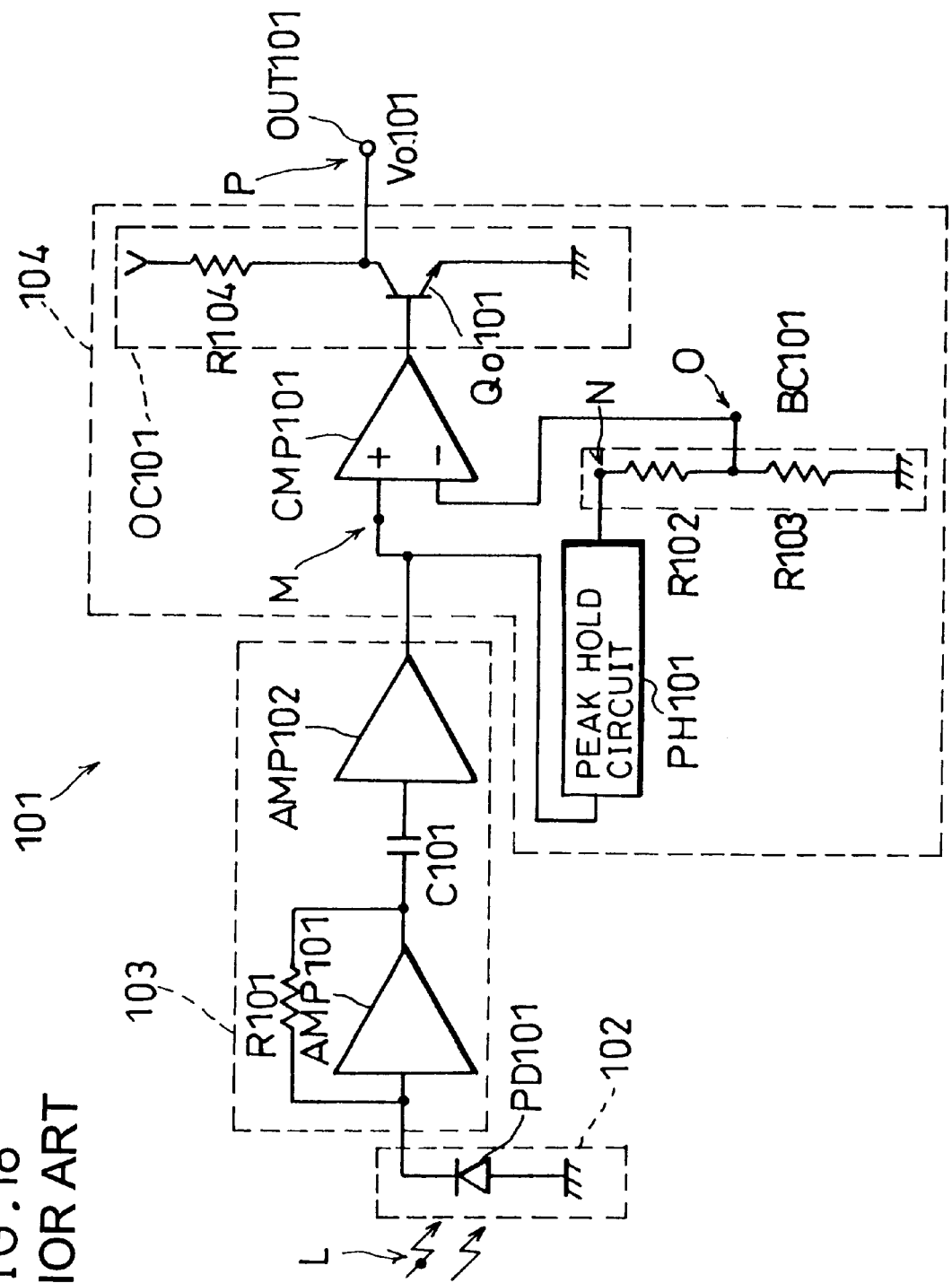
FIG. 18 is a block diagram depicting an arrangement of a conventional data communication receiving element.
Figure 19:
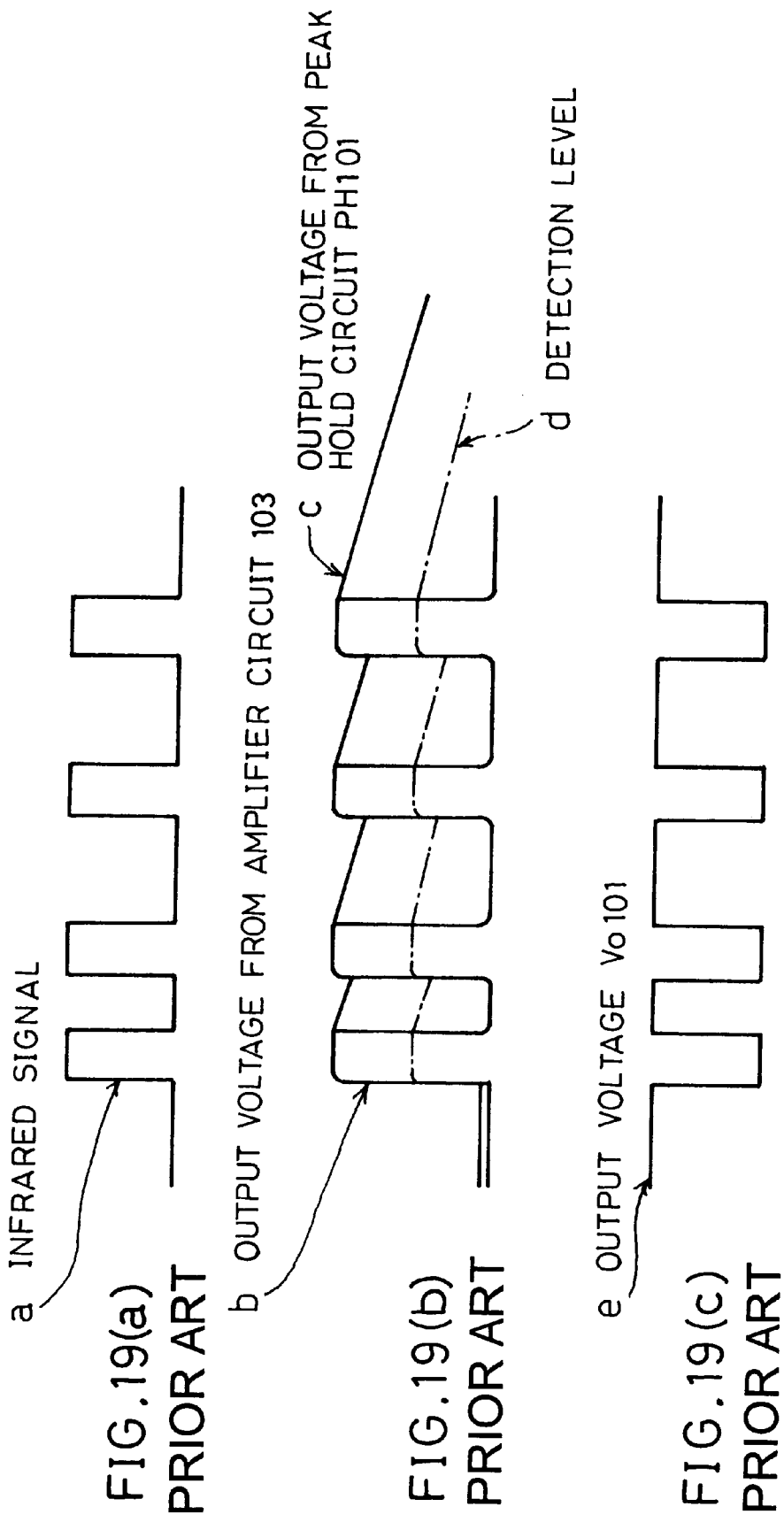
FIGS. 19(a) through 19(c) are views showing the waveforms at the points indicated in the data communication receiving element of FIG. 18.
Figure 20:
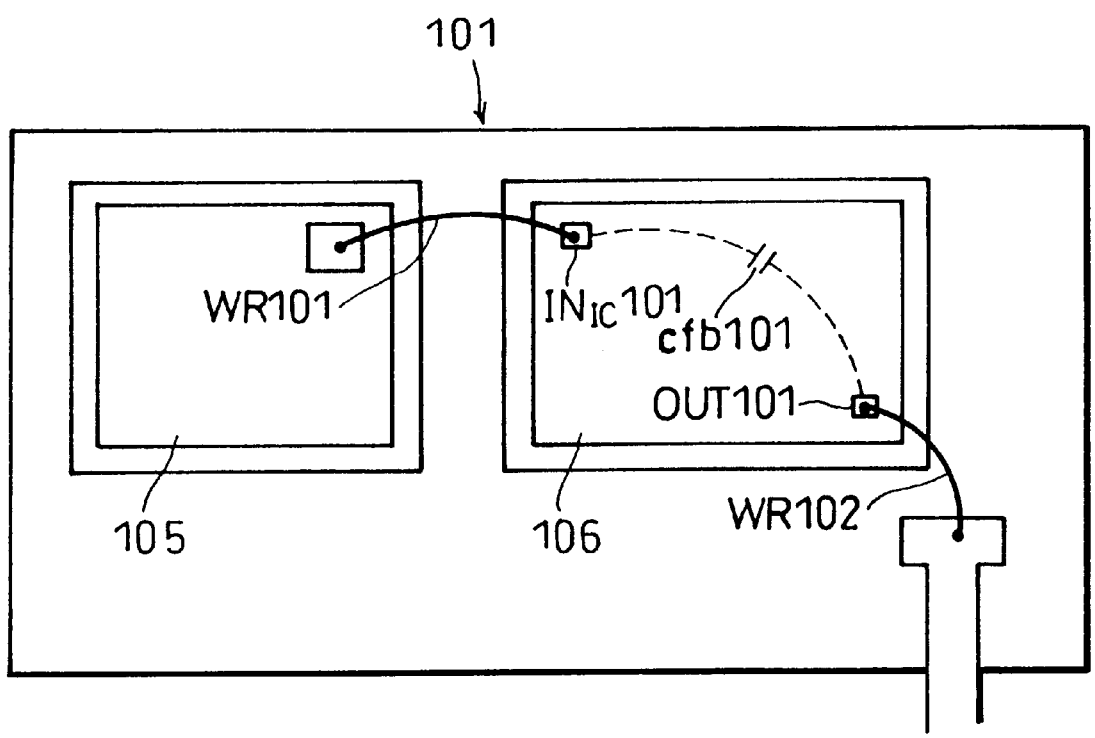
FIG. 20 is a view depicting a package arrangement of the data communication receiving element of FIG. 18.
Figure 21:
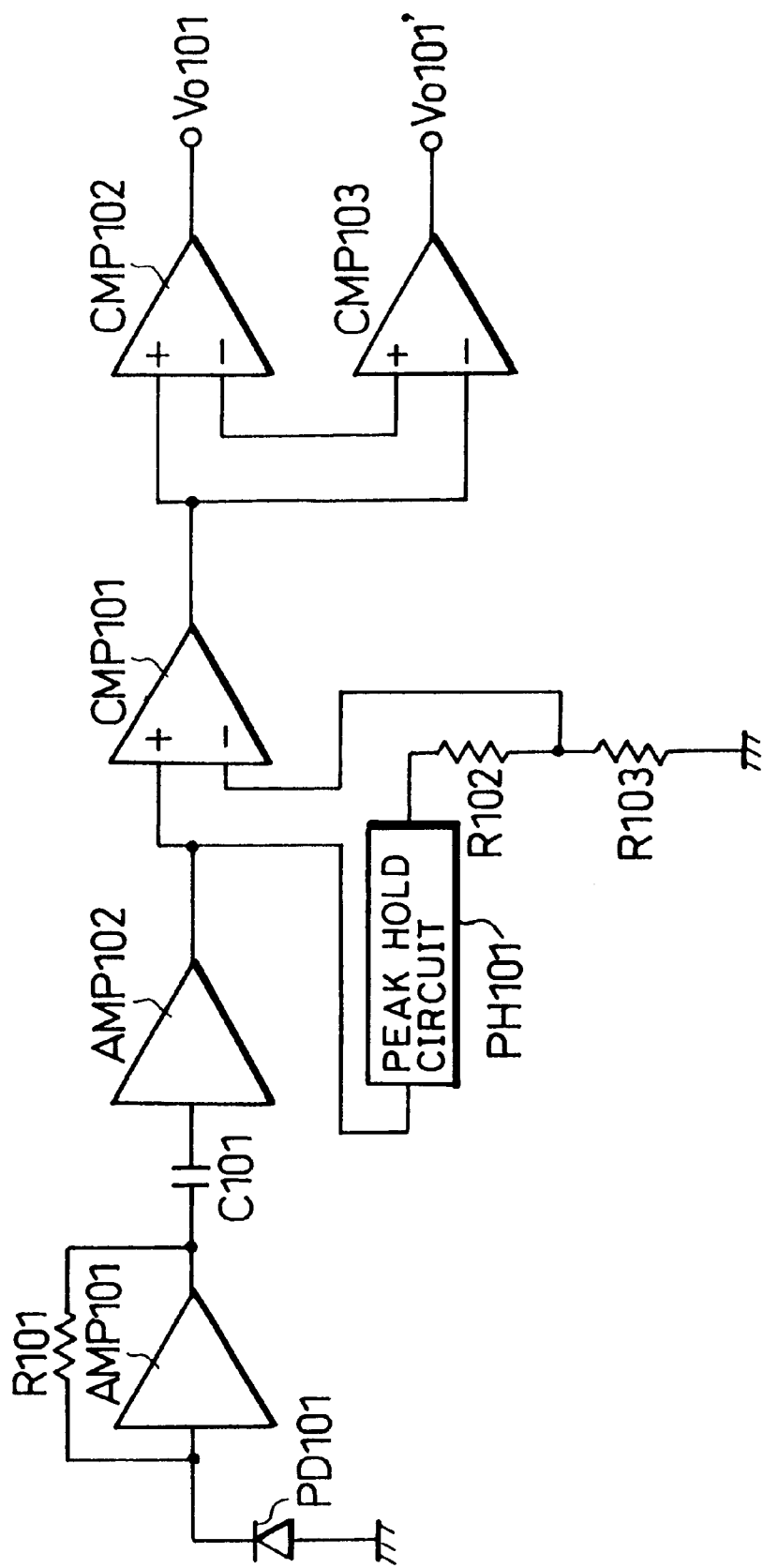
FIG. 21 is a block diagram depicting an arrangement of a data communication receiving element employing a conventional anti-phase generating circuit.

The anti-phase generating circuit 6 is connected to the output terminal of the output circuit OC in parallel herein. However, the arrangement of the same is not limited to the above disclosure. For example, as shown in FIG. 17, the anti-phase generating circuit 6 may be connected to the latter stage of the data communication receiving element 1 in parallel to the output terminal OUT of the integrator 5. In a data communication receiving element 12 arranged in this manner, the anti-phase generating circuit 6 outputs an anti-phase pulse in response to a pulse having the predetermined rising time Trise and falling time Tfall outputted from the integrator 5. Thus, the feedback current from the output end to the input end can be reduced further, thereby increasing the effect of suppressing the deterioration of the S/N ratio.

Figure 16:
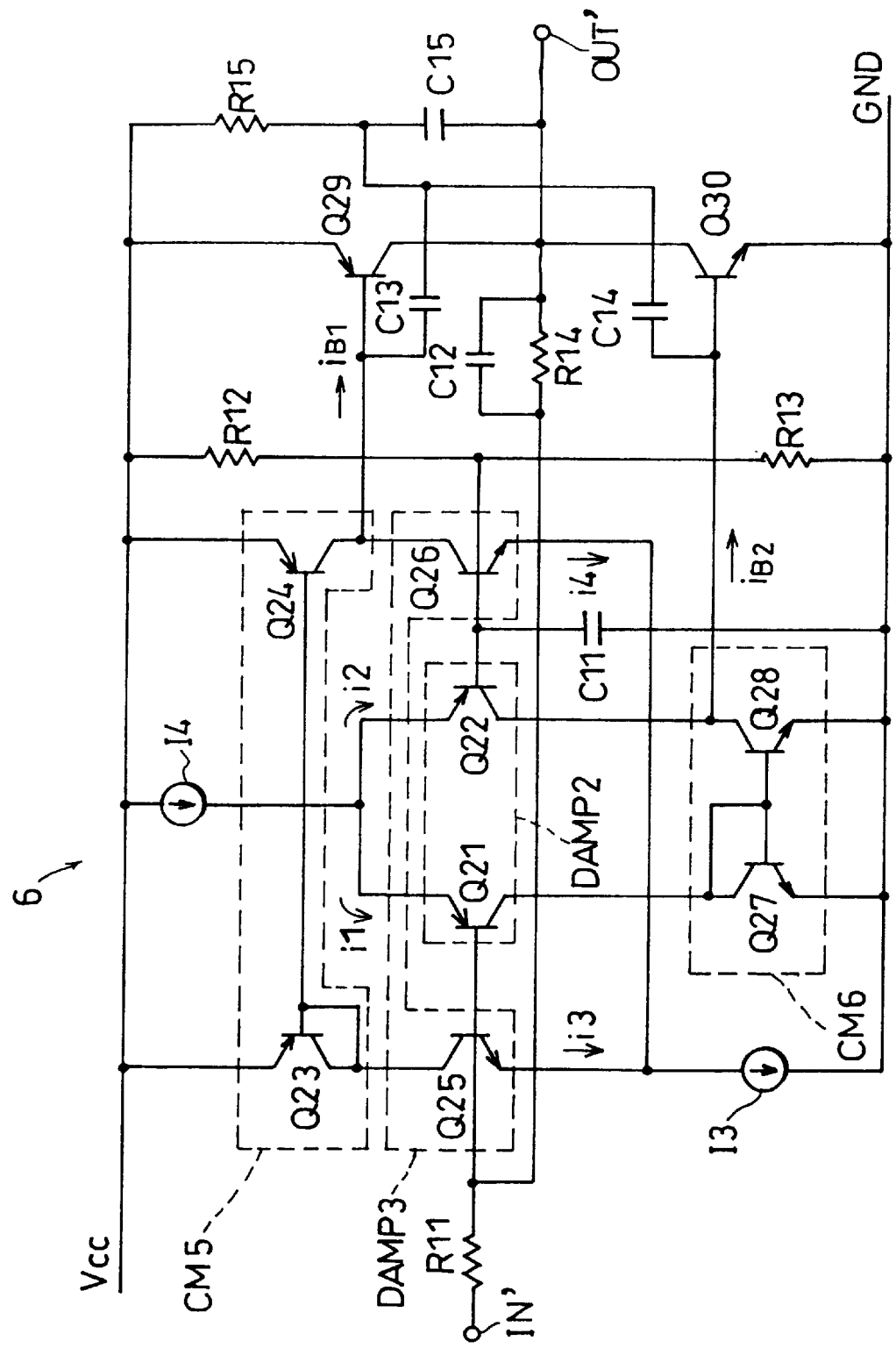
FIG. 16 is a circuit diagram showing an arrangement of an example anti-phase generating circuit in the data communication receiving element of FIG. 14.

Next, an example anti-phase generating circuit 6 illustrated in FIG. 16 will be explained. Of all the components forming the anti-phase generating circuit 6, the input resistor R11, resistors R12 and R13, feedback resistor R14, and capacitors C11 and C12 are identical with their respective counterparts explained above, and the explanation of the same is omitted herein. Only the components forming a portion corresponding to the operational amplifier OP will be explained.

The operational amplifier OP is composed of differential amplifiers DAMP2 and DAMP3, current mirror circuits CM5 and CM6, output transistors Q29 and Q30, a resistor R15, capacitors C13, C14, and C15, and constant current sources I3 and I4.

The differential amplifier DAMP2 is composed of a pair of transistors Q21 and Q22 whose emitters are connected to each other. The base of the transistor Q21 is connected to the inverting input terminal of the operational amplifier OP, and the collector of the same is connected to the collector of a transistor Q27 described below. The base of the transistor Q22 is connected to the non-inverting input terminal of the operational amplifier OP, and the collector of the same is connected to the collector of a transistor Q28 described below.

The differential amplifier DAMP3 is composed of a pair of transistors Q25 and Q26 whose emitters are connected to each other. The base of the transistor Q25 is connected to the inverting input terminal of the operational amplifier OP, and the collector of the same is connected to the collector of a transistor Q23 described below. The base of the transistor Q26 is connected to the non-inverting input terminal of the operational amplifier OP, and the collector of the same is connected to the collector of a transistor Q24 described below.

The current mirror circuit CM5 is composed of a pair of transistors Q23 and Q24 whose bases are connected to each other. The emitter of the transistor Q23 is connected to the terminal of the power source, and the collector of the same is connected to its own base. The emitter of the transistor Q24 is connected to the terminal of the power source.

The current mirror circuit CM6 is composed of a pair of transistors Q27 and Q28 whose bases are connected to each other. The collector of the transistor Q27 is connected to its own base, and the emitter of the same is grounded. The emitter of the transistor Q28 is grounded.

The base of the output transistor Q29 is connected to the connecting point of the transistors Q24 and Q26, and the emitter of the same is connected to the terminal of the power source, while the collector of the same is connected to the collector of an output transistor Q30 described below. The base of the output transistor Q30 is connected to the connecting point of the transistors Q22 and Q28, and the emitter of the same is grounded.

One end of the resistor R15 is connected to the terminal of the power source, and the other end of the same is connected to one end of a capacitor C15 described below. One end of the capacitor C13 is connected to the base of the output transistor Q29, and the other end of the same is connected to one end of a capacitor C15 described below. One end of the capacitor C14 is connected to the base of the output transistor Q30, and the other end of the same is connected to one end of the capacitor C15. Also, the other end of the capacitor C15 is connected to the output terminal OUT'.

One end of the constant current source I3 is connected to the connecting point of the transistors Q25 and Q26, and the other end of the same is grounded. One end of the constant current source I4 is connected to the terminal of the power source, and the other end of the same is connected to the connecting point of the transistors Q21 and Q22.

Next, the operation of the above-arranged anti-phase generating circuit 6 will be explained in the following.

When a high-level input voltage Vin is inputted to the input terminal IN' of the anti-phase generating circuit 6, the relation between the emitter currents i1 and i2 of the transistors Q21 and Q22 in the differential amplifier DAMP2 is expressed as i1−i2, because the base voltage of the transistor Q21 is higher than the base voltage of the transistor Q22.

Here, as being the current mirror circuit CM6, the collector currents of the transistors Q27 and Q28 must be made equal. Thus, a current $i_{B2}$=i2−i1 flows in the base of the output transistor Q30, whereupon the transistor Q30 switches ON.

On the other hand, the relation between the emitter currents i3 and i4 of the transistors Q25 and Q26 in the differential amplifier DAMP3 is expressed as i3>i4, because the base voltage of the transistor Q25 is higher than the base voltage of the transistor Q26.

Here, by being the current mirror circuit CM5, the collector currents of the transistors Q23 and Q24 must be made equal. Thus, a current $i_{B1}$=i3−i4 flows in the collector of the transistor Q26 from the output transistor Q29, whereupon the output transistor Q29 switches OFF.

Consequently, the output voltage Vo' from the output terminal OUT' shifts to the low level, and therefore, the anti-phase output voltage Vo' is obtained in response to the high-level input voltage Vi, namely, the positive-phase output voltage Vo. Here, the capacitor C15 differentiates a change in the output voltage Vo', and the capacitors C13 and C14 feedback the transient output to the bases of the output transistors Q29 and Q30, whereby the operation of the output transistors Q29 and Q30 can be stabilized.

Conversely, when a low-level input voltage Vin is inputted to the input terminal IN' of the anti-phase generating circuit 6, the relation is expressed as i1>i2 in the differential amplifier DAMP2, because the base voltage of the transistor Q21 is lower than the base voltage of the transistor Q22.

Thus, the current $i_{B2}$=i1−i2 flows in the collector of the transistor Q28 from the base of the output transistor Q30, whereupon the output transistor Q30 switches OFF.

On the other hand, the relation is expressed as i3<i4 in the differential amplifier DAMP3, because the base voltage of the transistor Q25 is lower than the base voltage of the transistor Q26.

Thus, the current $i_{B1}$=i4−i1 flows in the base of the output transistor Q29, whereupon the output transistor Q29 switches ON.

Consequently, the output voltage Vo' shifts to the high level, and the anti-phase voltage Vo' is obtained in response to the low-level input voltage Vin, namely, the positive-phase output voltage Vo.

The anti-phase generating circuit 6 operates in the manner described above. In addition to this operation, how the deterioration of the S/N ratio is suppressed by providing the aforementioned characteristic package arrangement of the data communication receiving element 11 shown in FIG. 15 will be explained.

As shown in FIG. 15, the package of the data communication receiving element 11 is composed of a photodiode chip 7, a receiving IC chip 8, a die-bond frame 9, an output lead pin LP serving as a first lead frame of the output voltage Vo, another output lead pin LP' serving as a second lead frame of the output voltage Vo', and a resin mold 10.

The cathode K of the photodiode chip 7 is wire-bonded to the input terminal $IN_1c$ of the receiving IC chip 8 through a wire WR1 serving as a first wire. Further, the output terminal OUT is wire-bonded to the output lead pin LP through a wire WR2 serving as a second wire, and the output terminal OUT' is wire-bonded to the output lead pin LP' through a wire WR2' serving as a third wire.

In the above-arranged package of the data communication receiving element 11, coupling capacities cfb and cfb' are generated across the input end including the input terminal $IN_{IC}$ and wire WR1 and the output end including the output terminal OUT and wire WR2, and across the input end including the input terminal $IN_{IC}$ and wire WR1 and the output end including the output terminal OUT' and wire WR2', respectively. Here, if the output terminals OUT and OUT' and the output lead pins LP and LP' are respectively provided adjacently and the wires WR2 and WR2' are provided in parallel to each other, cfb=cfb'.

On the other hand, as previously mentioned, the feedback current ifb generated by a change in the positive-phase output voltage Vo can be expressed by Equation (2) above. Likewise, the feedback current ifb' generated by a change in the anti-phase output voltage Vo' can be expressed using Equation (2) above. Since the polarity of the feedback current ifb' is reversed to that of the feedback current ifb, if the waveforms of the output voltage Vo and output voltage Vo' are identical and cfb=cfb', then, $$ifb+ifb'=0 \qquad (9).$$

Thus, the feedback current ifb caused by the positive-phase output and the feedback current ifb' caused by the anti-phase output cancel out with each other completely. Consequently, since an overall feedback current is reduced to 0 (zero), the deterioration of the S/N ratio can be suppressed as fully as possible.

Also, since the aforementioned anti-phase generating circuit 6 generates the anti-phase output voltage Vo' using the positive-phase output voltage Vo, when a load is connected to the output terminal OUT, the waveform of the output voltage Vo' changes as the waveform of the output voltage Vo changes by the affect of the load. Consequently, Equation (9) can be also established at high accuracy in this case, thereby making it possible to suppress the deterioration of the S/N ratio.

The case where the package arrangement is adopted for the data communication receiving element 11 was explained above, but the package arrangement can be adopted for the data communication receiving element 12 as well. In this case, the wire WR2 serves as a fourth wire and the output lead pin LP serves as a third lead frame.

As has been explained, the data communication receiving element 11/12 of the present embodiment is arranged to include the anti-phase generating circuit 6, so that not only the output voltage Vo, but also the anti-phase output voltage Vo' with respect to the output voltage Vo are outputted. Also, the package is arranged in such a manner that the output terminals OUT and OUT' are provided adjacently while the wires WR2 and WR2' are provided in parallel to each other.

Consequently, an overall feedback current from the output end to the input end of the data communication receiving element 11/12 can be reduced, and hence the deterioration of the S/N ratio can be suppressed.

As has been explained, a first data communication receiving element of the present invention is arranged to include waveform changing means for changing a substantially square pulse to a non-square pulse to be outputted by extending a rising time necessary for shifting the substantially square pulse from a low potential to a high potential level, and a falling time necessary for shifting the substantially square pulse from the high potential level to the low potential level.

Accordingly, a feedback current from the output end to the input end of the data communication receiving element in response to a change in the voltage during the rising time and falling time of the non-square pulse can be reduced, thereby making it possible to suppress the deterioration of the S/N ratio. Consequently, there can be attained an effect that the degradation of the performance of the data communication receiving element can be prevented.

It is preferable to arrange the data communication receiving element to further include a rising/falling time adjusting circuit for adjusting the rising time and the falling time of an output waveform. Accordingly, a variance of the pulse width of the output voltage with a change in the power source voltage can be suppressed. Consequently, a data communication receiving element operable on an extensive range of the power source voltage can be realized without degrading the communication performance.

The waveform changing means can be realized by, for example, an integrator including:

a capacitor;

charging/discharging means for charging the capacitor with a constant current during the rising time of the non-square pulse, and discharging the capacitor with a constant current during the falling time of the non-square pulse; and voltage delivering means for delivering a voltage based on a voltage applied to the capacitor to an output terminal.

According to the above arrangement, the charging/discharging means can charge the capacitor with a constant current during the rising time, while discharging the same at a constant current during the falling time. Consequently, the voltage applied to the capacitor rises on a proportional basis with respect to a lapse of time during the rising time, and drops on a proportional basis with respect to a lapse of time during the falling time.

The voltage delivering means outputs a voltage based on a voltage applied to the capacitor by delivering the same to the output terminal. Also, the voltage delivering means outputs a constant high potential level voltage to the output terminal since the charging of the capacitor ends until the discharging of the capacitor begins. Further, the voltage delivering means outputs a low potential level voltage to the output terminal since the discharging ends until the charging starts.

Accordingly, the integrator changes the input substantially square pulse to a trapezoidal pulse to be outputted. Consequently, desired rising time and falling time can be set by adequately adjusting a value of the elements forming the integrator.

It is preferable to arrange the data communication receiving element to further include voltage varying rate changing means for changing a voltage varying rate on a proportional basis with respect to a lapse of time during each of the rising time and falling time of the non-square pulse.

According to the above arrangement, the voltage varying rate changing means changes the voltage varying rate during the rising time and falling time of the non-square pulse to make the rising and falling of the non-square pulse non-linear.

Thus, when the high potential level of the non-square pulse needs to be raised higher, the pulses start to rise and fall gradually, thereby minimizing a portion having a large voltage varying rate over time. Consequently, the deterioration of the S/N ratio of the data communication receiving element can be suppressed, and at the same time a sufficient design margin can be secured for the digital circuit threshold level in the following stage.

It is preferable to arrange the waveform changing means to further include potential rising means for rising a potential of the non-square pulse to a maximum potential level, which is higher than the high potential level, during a period since the charging of the capacitor ends until the discharging of the capacitor begins.

According to the above arrangement, the potential of the non-square pulse is raised to the maximum potential level, which is higher than the aforementioned high potential level, by the potential rising means by the time the charging of the capacitor ends. The maximum potential level is maintained until the discharging of the capacitor begins, and it starts to drop once the discharging of the capacitor begins.

Consequently, the maximum potential of the non-square pulse can be raised so high that a sufficient design margin can be secured for the digital circuit threshold level in the following stage.

It is preferable to arrange the data communication receiving element in such a manner that the waveform changing means has two output terminals for outputting the non-square pulse, and that the waveform changing means includes anti-phase generating means for outputting the non-square pulse outputted from one of the two output terminals after having inverted a phase of the non-square pulse.

According to the above arrangement, the non-square pulse outputted from the waveform changing means is branched from the output terminal of the waveform changing means and inputted to the anti-phase generating means. The anti-phase generating means outputs the non-square pulse after having inverted the phase thereof. Consequently, both the positive phase non-square pulse and anti-phase non-square pulse are outputted.

Thus, an overall feedback current can be reduced more effectively, because not only can the rising time and falling time of the output voltage of the data communication receiving element be extended, but also the positive-phase and anti-phase feedback currents from the output end to the input end of the data communication receiving element cancel out with each other.

In addition, even when the positive-phase output terminal is connected to the load and the waveform of the positive-phase output varies, the waveform of the anti-phase output varies as well. Hence, the effect of reducing the feedback current can be maintained. Consequently, the deterioration of the S/N ratio of the data communication receiving element can be suppressed, thereby preventing the degradation of the performance of the same.

Further, it is preferable to arrange the data communication receiving element to further include:

a first wire for electrically connecting the photo receiving element and the amplifying means;

a fourth wire for electrically connecting an output terminal of the waveform changing means and a third lead frame for outputting an output voltage from the waveform changing means to an external; and a third wire for electrically connecting an output terminal of the anti-phase generating means and a second lead frame for outputting an output voltage from the anti-phase generating means to the external, wherein, the output terminal of the waveform changing means, the output terminal of the anti-phase generating means, the third wire, and the fourth wire are provided in such a manner that a coupling capacity generated across an end of the photo-receiving element and the first wire, and an end of the output terminal of the waveform changing means and the fourth wire becomes equal to a coupling capacity generated across the end of the photo-receiving element and the first wire, and an end of the output terminal of the anti-phase generating means and the third wire.

According to the above arrangement, a coupling capacity is generated across the end of the photo-receiving element and the first wire, and the end of the output terminal of the waveform changing means and the fourth wire. Likewise, a coupling capacity is generated across the end of the photo-receiving element and the first wire, and the end of the output terminal of the anti-phase generating means and the third wire.

Here, the output terminal of the waveform changing means, the output terminal of the anti-phase generating means, the third wire, and the fourth wire are provided in such a manner that the above two coupling capacities become equal.

Consequently, the feedback currents, caused by changes in the voltages of the positive-phase output and anti-phase output, cancel out with each other completely, thereby suppressing the deterioration of the S/N ratio of the data communication receiving element as fully as possible.

A second data communication receiving element of the present invention is arranged in such a manner that the waveform shaping means has two output terminals for outputting the substantially square pulse, and that the waveform shaping means includes anti-phase generating means for outputting the substantially square pulse outputted from one of the two output terminals after having inverted a phase of the substantially square pulse.

Accordingly, the feedback currents caused by a change in voltages at the positive-phase output terminal and anti-phase output terminal are applied from the output end to the input end of the data communication receiving element in such a manner to cancel out with each other, thereby reducing an overall feedback current. Also, even when the positive-phase output terminal is connected to the load and the waveform of the positive-phase output varies, the waveform of the anti-phase output varies as well. Thus, the effect of reducing an overall feedback current can be maintained also in this case.

Consequently, the deterioration of the S/N ratio of the data communication receiving element can be suppressed, and hence, there can be attained an effect that the degradation of the performance of the data communication receiving element can be prevented.

The anti-phase generating means can be realized by an inverting amplifier, for example. According to this arrangement, the substantially square pulse outputted from the waveform shaping means or the non-square pulse outputted from the waveform changing means is inputted to the inverting amplifier. The inverting amplifier outputs the substantially square pulse or non-square pulse after it has inverted the phase thereof.

Thus, using the inverting amplifier makes it possible to realize the anti-phase generating means in a simple manner.

It is preferable to arrange the data communication receiving element to further include:

a first wire for electrically connecting the photo-receiving element and the amplifying means;

a second wire for electrically connecting an output terminal of the waveform shaping means and a first lead frame for outputting an output voltage from the waveform shaping means to an external; and a third wire for electrically connecting an output terminal of the anti-phase generating means and a second lead frame for outputting an output voltage from the anti-phase generating means to the external, wherein, the output terminal of the waveform shaping means, the output terminal of the anti-phase generating means, the second wire, and the third wire are provided in such a manner that a coupling capacity generated across an end of the photo-receiving element and the first wire, and an end of the output terminal of the waveform shaping means and the second wire becomes equal to a coupling capacity generated across the end of the photo-receiving element and the first wire, and the end of the output terminal of the anti-phase generating means and the third wire.

According to the above arrangement, a coupling capacity is generated across the end of the photo-receiving element and the first wire, and the end of the output terminal of the waveform shaping means and the second wire. Likewise, a coupling capacity is generated across the end of the photo-receiving element and the first wire, and the end of the output terminal of the anti-phase generating means and the third wire.

Here, the output terminal of the waveform shaping means, the output terminal of the anti-phase generating means, the second wire, and the third wire are provided in such a manner that the above two coupling capacities become equal.

Consequently, the feedback currents caused by changes in the voltages of the positive-phase output and anti-phase output cancel out with each other completely, thereby suppressing the deterioration of the S/N ratio of the data communication receiving element as fully as possible.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A data communication receiving element for receiving data via a light signal comprising:

a photo-receiving element for receiving the light signal and converting said light signal to a current signal;

amplifying means for amplifying said current signal after converting said current signal to a voltage signal;

waveform shaping means for shaping an output voltage waveform from said amplifying means to a substantially square pulse; and waveform changing means for changing said substantially square pulse to a non-square pulse for output, and suppressing deterioration of a signal to noise ratio of the data communication receiving element by extending a rising time of said substantially square pulse so as to gradually increase from a relatively low potential level to a relatively high potential level, and extending a falling time of said substantially square pulse so as to gradually decrease from the relatively high potential level to the relatively low potential level.

2. The data communication receiving element of claim 1 further comprising a rising/falling time adjusting circuit for adjusting the rising time and the falling time of an output waveform.

3. The data communication receiving element of claim 2, wherein said rising/falling time adjusting circuit adjusts the rising time and falling time in accordance with a value of a power source voltage.

4. The data communication receiving element of claim 3, wherein:

said waveform changing means includes a differential amplifier; and said rising/falling time adjusting circuit shortens the rising time and falling time by increasing a current flowing through said differential amplifier when said power source voltage exceeds a predetermined value.

5. The data communication receiving element of claim 1, wherein said waveform changing means is an integrator including:

a capacitor;

charging/discharging means for charging said capacitor with a constant current during the rising time of said non-square pulse, and discharging said capacitor at a constant current during the falling time of said non-square pulse; and voltage delivering means for delivering a voltage based on a voltage applied to said capacitor to an output terminal.

6. The data communication receiving element of claim 1 further comprising voltage varying rate changing means for changing a voltage varying rate on a proportional basis with respect to a lapse of time during each of the rising time and falling time of said non-square pulse.

7. The data communication receiving element of claim 5, wherein said waveform changing means further includes potential rising means for increasing a potential of said non-square pulse to a maximum potential level, which is higher than said relatively high potential level, during a period from charging of said capacitor ending until discharging of said capacitor begins.

8. The data communication receiving element of claim 1, wherein:

said waveform changing means includes at least two output terminals for outputting said non-square pulse; and said data communication receiving element further comprises, anti-phase generating means for outputting said non-square pulse received from one of said two output terminals after having inverted a phase of said non-square pulse.

9. The data communication receiving element of claim 8, wherein said anti-phase generating means is an inverting amplifier.

10. The data communication receiving element of claim 8 further comprising:

a first wire for electrically connecting said photo-receiving element and said amplifying means;

a second wire for electrically connecting an output terminal of said waveform changing means and a first lead frame for outputting an output voltage from said waveform changing means; and a third wire for electrically connecting an output terminal of said anti-phase generating means and a second lead frame for outputting an output voltage from said anti-phase generating means, wherein, the output terminal of said waveform changing means, the output terminal of said anti-phase generating means, said second wire, and said third wire are provided in such a manner that a first coupling capacity becomes equal to a second coupling capacity, said first coupling capacity being generated between an end of said photo-receiving element plus said first wire, and the output terminal of said waveform changing means plus said second wire and said second coupling capacity being generated between an end of said photo-receiving element plus said first wire, and the output terminal of said anti-phase generating means plus said third wire.

11. A data communication receiving element for receiving data vial a light signal comprising:

a photo-receiving element for receiving the light signal and converting said light signal to a current signal;

amplifying means for amplifying said current signal after converting said current signal to a voltage signal; and waveform shaping means for shaping an output voltage waveform from said amplifying means to a substantially square pulse, wherein said waveform shaping means includes two output terminals for outputting said substantially square pulse; and anti-phase generating means for outputting said substantially square pulse received from one of said two output terminals after having inverted a phase of said substantially square pulse so as to suppress deterioration of a signal to noise ratio of the data communication receiving element.

12. The data communication receiving element of claim 11, wherein said anti-phase generating means is an inverting amplifier.

13. The data communication receiving element of claim 11, further, comprising:

a first wire for electrically connecting said photo-receiving element and said amplifying means;

a second wire for electrically connecting an output terminal of said waveform shaping means and a first lead frame for outputting an output voltage from said waveform shaping means; and a third wire for electrically connecting an output terminal of said anti-phase generating means and a second lead frame for outputting an output voltage from said anti-phase generating means, wherein, the output terminal of said waveform shaping means, the output terminal of said anti-phase generating means, said second wire, and said third wire are provided in such a manner that a first coupling capacity becomes equal to a second coupling capacity, the first coupling capacity being generated between an end of said photo-receiving element plus said first wire, and the output terminal of said waveform shaping means plus said second wire and said second coupling capacity being generated between an end of said photo-receiving element plus said first wire, and the output terminal of said anti-phase generating means plus said third wire.

14. The data communication receiving element of claim 1, wherein the light signal is an infrared signal.

15. The light communication receiving element of claim 11, wherein the light signal is an infrared signal.

16. The data communication receiving element of claim 11, wherein the anti-phase generating means generates an output pulse which reduces an overall feedback current to substantially zero.

* * * * *